US012701804B2

(12) United States Patent
Mukai et al.

(10) Patent No.: US 12,701,804 B2
(45) Date of Patent: Aug. 4, 2026

(54) LIGHT RECEIVING ELEMENT ARRAY HAVING A LAMINATED SEMICONDUCTOR STRUCTURE AND MANUFACTURING METHOD THEREFOR

(71) Applicant: ROHM CO., LTD., Kyoto (JP)

(72) Inventors: Toshikazu Mukai, Kyoto (JP); Yoichi Mugino, Kyoto (JP); Yohei Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 370 days.

(21) Appl. No.: 18/360,021

(22) Filed: Jul. 27, 2023

(65) Prior Publication Data

US 2023/0369365 A1 Nov. 16, 2023

Related U.S. Application Data

(63) Continuation of application No. PCT/JP2022/001908, filed on Jan. 20, 2022.

(30) Foreign Application Priority Data

Mar. 22, 2021 (JP) ................................. 2021-047583

(51) Int. Cl.
*H10F 39/00* (2025.01)
*H10F 39/18* (2025.01)

(52) U.S. Cl.
CPC ......... *H10F 39/806* (2025.01); *H10F 39/024* (2025.01); *H10F 39/18* (2025.01)

(58) Field of Classification Search
CPC ...... H10F 39/806; H10F 39/024; H10F 39/18; H10F 30/20; H10F 39/021; H10F 39/107; H10F 39/12

(Continued)

(56) References Cited

U.S. PATENT DOCUMENTS

2005/0199976 A1* 9/2005 Iguchi ................... H10F 39/107
257/458
2014/0026957 A1* 1/2014 Lee ....................... H10F 77/147
438/72

FOREIGN PATENT DOCUMENTS

JP 2009170551 A * 7/2009
JP 2011137836 A * 7/2011
(Continued)

OTHER PUBLICATIONS

International Search Report for PCT/JP2022/001908, mailed on Apr. 19, 2022.

(Continued)

*Primary Examiner* — Mohammad M Hoque
(74) *Attorney, Agent, or Firm* — Rabin & Berdo, P.C.

(57) ABSTRACT

A light receiving element array includes a substrate and a laminated semiconductor structure that is formed on the substrate. The laminated semiconductor structure includes a light absorbing layer that is disposed above the substrate and a plurality of window layers of a first conductivity type that are formed apart from each other on the light absorbing layer. Inside the laminated semiconductor structure, there is formed, for each window layer, a first of second conductivity type region that extends into the light absorbing layer from a surface of the window layer at an opposite side to the light absorbing layer. Inside the light absorbing layer, there is formed a second of second conductivity type region that is disposed such as to surround each of the plurality of window layers in plan view and extends from a surface of the light absorbing layer at an opposite side to the substrate toward a surface of the light absorbing layer at the substrate side.

17 Claims, 38 Drawing Sheets

(58) Field of Classification Search
USPC ......................................................... 257/432
See application file for complete search history.

(56) References Cited

FOREIGN PATENT DOCUMENTS

| | | | |
|---|---|---|---|
| JP | 2012244124 A | * | 12/2012 |
| JP | 2016-225359 A | | 12/2016 |

OTHER PUBLICATIONS

Written Opinion of the International Searching Authority for PCT/
JP2022/001908, mailed on Apr. 19, 2022.
Office Action issued for corresponding Japanese patent application
No. 2023-508689 dated Dec. 4, 2025.

* cited by examiner

LIGHT RECEIVING ELEMENT ARRAY HAVING A LAMINATED SEMICONDUCTOR STRUCTURE AND MANUFACTURING METHOD THEREFOR

TECHNICAL FIELD

The present disclosure relates to a light receiving element array and a method for manufacturing the same.

BACKGROUND ART

Patent Literature 1 discloses a light receiving element array that includes an n-type substrate, a laminated semiconductor layer that is formed on the n-type substrate and also includes a plurality of light receiving elements. The laminated semiconductor layer is constituted of a light receiving layer that is formed on the n-type substrate and an n-type semiconductor layer that is formed on the light receiving layer. The laminated semiconductor layer has a plurality of p-type semiconductor regions in each element section area.

CITATION LIST

Patent Literature

Patent Literature 1: Japanese Patent Application Publication No. 2016-225359

The above and yet other objects, features, and effects of the present disclosure will become more apparent from the following description of the preferred embodiments made with reference to the attached drawings.

BRIEF DESCRIPTION OF DRAWINGS

Figure 1A:
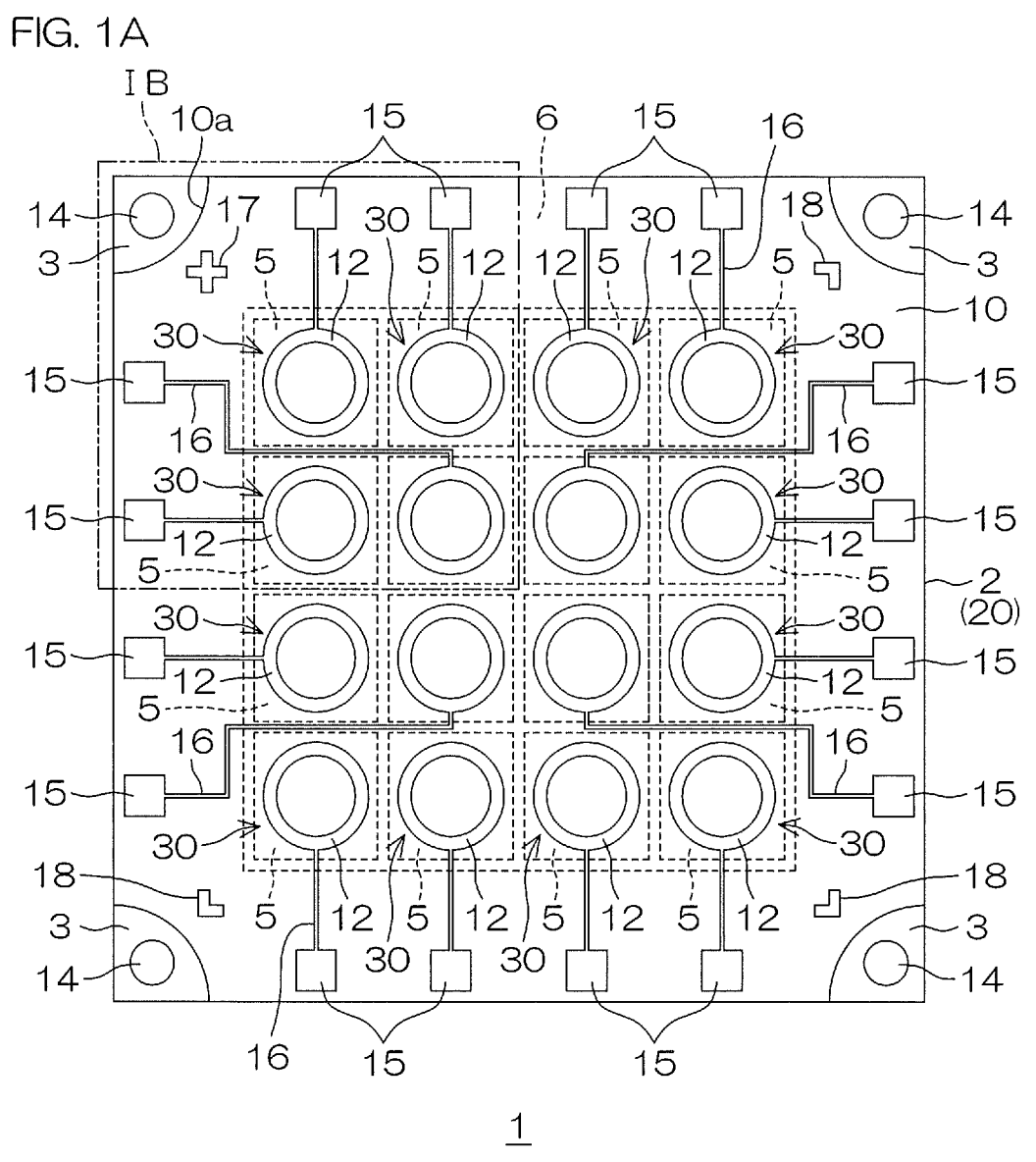

FIG. 1A is a plan view for describing the arrangement of a light receiving element array according to a first preferred embodiment of the present disclosure.

FIG. 8A is a sectional view showing the example of the manufacturing process of the light receiving element array shown in FIG. 1A to FIG. 3 and is a sectional view corresponding to a section plane of FIG. 3.

FIG. 8I is a sectional view showing a step subsequent to that of FIG. 8H.

DESCRIPTION OF EMBODIMENTS

Figure 1B:
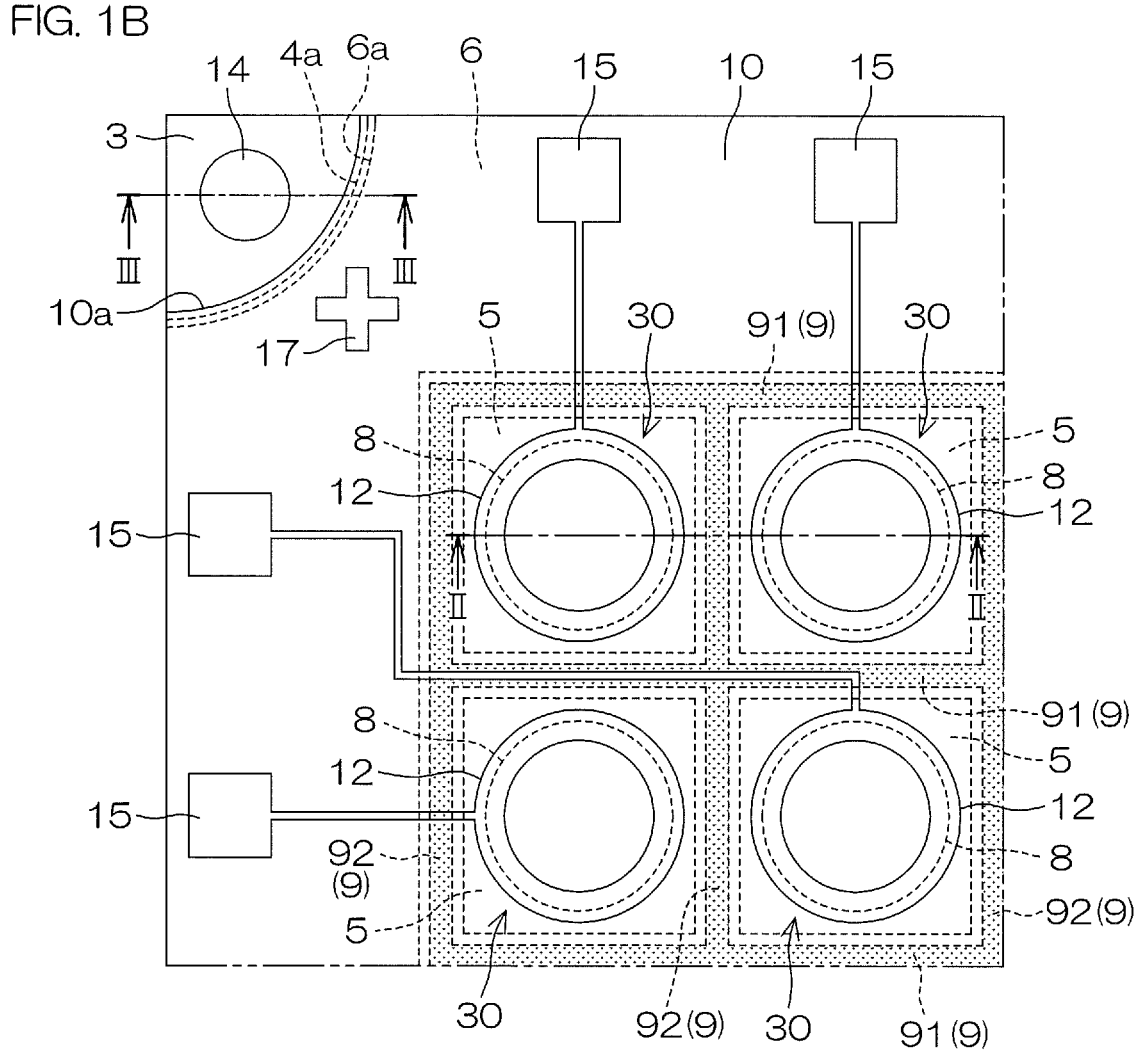
FIG. 1B is a partially enlarged plan view showing a portion IB of FIG. 1A.

Description of Preferred Embodiments of the Present Disclosure

A preferred embodiment of the present disclosure provides a light receiving element array including a substrate and a laminated semiconductor structure that is formed on the substrate and where the laminated semiconductor structure includes a light absorbing layer that is disposed above the substrate and a plurality of window layers of a first conductivity type that are formed apart from each other on the light absorbing layer, there is formed, inside the laminated semiconductor structure, for each window layer, a first of second conductivity type region that extends into the light absorbing layer from a surface of the window layer at an opposite side to the light absorbing layer, and there is formed, inside the light absorbing layer, a second of second conductivity type region that is disposed such as to surround each of the plurality of window layers in plan view and extends from a surface of the light absorbing layer at an opposite side to the substrate toward a surface of the light absorbing layer at the substrate side.

With this arrangement, crosstalk can be reduced.

In the preferred embodiment of the present disclosure, the second of second conductivity type region extends from the surface of the light absorbing layer at the opposite side to the substrate to an intermediate thickness of the light absorbing layer.

In the preferred embodiment of the present disclosure, the second of second conductivity type region penetrates through the light absorbing layer.

A preferred embodiment of the present disclosure provides a light receiving element array including a substrate and a laminated semiconductor structure that is formed on the substrate and where the laminated semiconductor structure includes a light absorbing layer that is disposed above the substrate and a plurality of window layers of a first conductivity type that are formed apart from each other on the light absorbing layer, there is formed, inside the laminated semiconductor structure, for each window layer, a second conductivity type region that extends into the light absorbing layer from a surface of the window layer at an opposite side to the light absorbing layer, and there is formed, inside the light absorbing layer, a separating groove that is disposed such as to surround each of the plurality of window layers in plan view and extends from a surface of the light absorbing layer at an opposite side to the substrate toward a surface of the light absorbing layer at the substrate side.

With this arrangement, crosstalk can be reduced.

In the preferred embodiment of the present disclosure, the separating groove penetrates through the light absorbing layer.

In the preferred embodiment of the present disclosure, an insulating film that is formed on the light absorbing layer such as to cover the plurality of window layers and a plurality of first electrodes that are provided for each window layer and disposed on the insulating film are included and each first electrode is electrically connected to the corresponding first of second conductivity type region.

In the preferred embodiment of the present disclosure, an insulating film that is formed on the light absorbing layer such as to cover the plurality of window layers and a plurality of first electrodes that are provided for each window layer and disposed on the insulating film are included and each first electrode is electrically connected to the corresponding second conductivity type region.

In the preferred embodiment of the present disclosure, the insulating film is an antireflection film that prevents reflection of light of a wavelength set in advance.

In the preferred embodiment of the present disclosure, the first electrodes are of endless shapes in plan view.

In the preferred embodiment of the present disclosure, a second electrode that is formed on a second main surface of the substrate.

In the preferred embodiment of the present disclosure, the plurality of window layers are disposed in a matrix in plan view.

In the preferred embodiment of the present disclosure, the laminated semiconductor structure includes a buffer layer of the first conductivity type that is formed between the substrate and the light absorbing layer.

In the preferred embodiment of the present disclosure, the buffer layer has an exposed surface at a portion of a surface at an opposite side to the substrate and a third electrode is formed on the exposed surface.

In the preferred embodiment of the present disclosure, the substrate is an n-type InP substrate, the light absorbing layer is a non-doped InGaAs layer, and the window layers are n-type InP layers.

In the preferred embodiment of the present disclosure, the substrate is an n-type InP substrate, the buffer layer is an n-type InP layer, the light absorbing layer is a non-doped InGaAs layer, and the window layers are n-type InP layers.

A preferred embodiment of the present disclosure provides a method for manufacturing light receiving element array including a step of forming, on a substrate, a laminated semiconductor structure including a light absorbing layer and a plurality of window layers of a first conductivity type that are formed apart from each other on the light absorbing layer, a step of forming, inside the laminated semiconductor structure, for each window layer, a first of second conductivity type region that extends into the light absorbing layer from a surface of the window layer at an opposite side to the light absorbing layer, and a step of forming a second of second conductivity type region that is disposed such as to surround each of the plurality of window layers in plan view and extends from a surface of the light absorbing layer at an opposite side to the substrate toward a surface of the light absorbing layer at the substrate side.

With this manufacturing method, a light receiving element array by which crosstalk can be reduced can be obtained.

In the preferred embodiment of the present disclosure, the step of forming the first of second conductivity type regions and the step of forming the second of second conductivity type region are performed in the same step.

In the preferred embodiment of the present disclosure, a step of forming an insulating film on the light absorbing layer such as to cover the plurality of window layers, a step of forming, for each window layer, a first electrode, electrically connected to the first of second conductivity type region, on the insulating film, and a step of forming a second electrode on a surface of the substrate at an opposite side to the laminated semiconductor structure are further included.

DETAILED DESCRIPTION OF PREFERRED EMBODIMENTS OF THE PRESENT DISCLOSURE

Preferred embodiments of the present disclosure shall be described in detail below with reference to the attached drawings.

FIG. 1A is a plan view for describing the arrangement of a light receiving element array according to a first preferred embodiment of the present disclosure. FIG. 1B is a partially enlarged plan view showing a portion IB of FIG. 1A. FIG.

Figure 3:
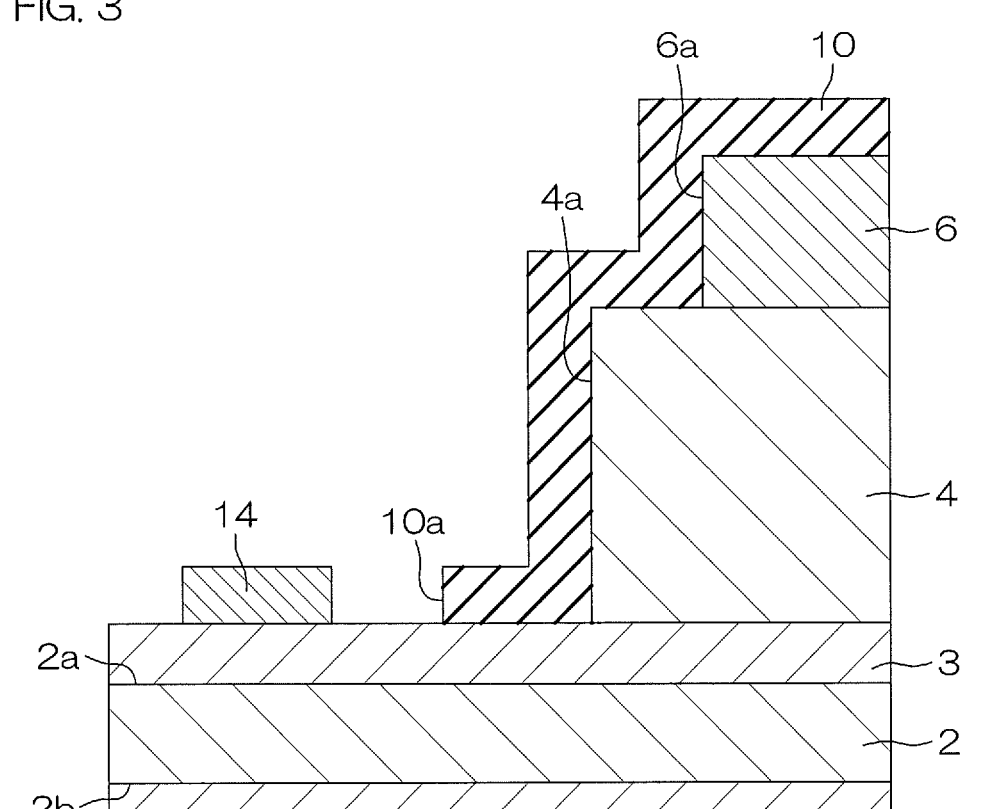
FIG. 3 is a diagrammatic sectional view taken along line III-III of FIG. 1B.

2 is a diagrammatic sectional view taken along line II-II of FIG. 1B. FIG. 3 is a diagrammatic sectional view taken along line III-III of FIG. 1B.

In the following, a right/left direction of the sheet surface of FIG. 1A may be referred to at times as a lateral direction and an up/down direction of the sheet surface of FIG. 1A may be referred to at times as a longitudinal direction.

A light receiving element array 1 has a rectangular parallelepiped shape. In this preferred embodiment, a shape in plan view of the light receiving element array 1 is a square shape having two sides parallel to the lateral direction and two sides parallel to the longitudinal direction.

The light receiving element array 1 includes a substrate 2 that has a first main surface (front surface) 2a and a second main surface (rear surface) 2b at an opposite side thereof and a laminated semiconductor structure 20 that is formed on the first main surface 2a of the substrate 2. The laminated semiconductor structure 20 includes a buffer layer 3 of an n-type that is formed on the first main surface 2a of the substrate 2 and a non-doped light absorbing layer 4 that is formed on a region of a buffer layer 3 front surface that excludes four corner portions. The laminated semiconductor structure 20 further includes a plurality of window layers 5 of the n-type that are formed apart from each other in a central portion region of a front surface of the light absorbing layer 4 and an n-type layer 6 that is formed on a peripheral edge portion of the front surface of the light absorbing layer 4 such as to surround the window layer group. The laminated semiconductor structure 20 further includes contact layers 7 of a p-type that are formed on respective window layers 5 and contact first p-type regions 8 to be described below.

Inside the laminated semiconductor structure 20, there is formed, for each window layer 5, the first p-type region 8 that extends into the light absorbing layer 4 from a surface of the window layer 5 at an opposite side to the light absorbing layer 4. Inside the light absorbing layer 4 is formed a second p-type region 9 that is disposed such as to surround each of the plurality of window layers 5 in plan view and extends from a surface of the light absorbing layer 4 at an opposite side to the substrate 2 toward a surface of the light absorbing layer 4 at the substrate 2 side. In FIG. 1B, the second p-type region 9 is shown with dots added for clarity.

The light receiving element array 1 includes an insulating film 10 that covers a portion of an exposed surface of the buffer layer 3, an exposed surface of the light absorbing layer 4, exposed surfaces of the window layer 5, an exposed surface of the n-type layer 6, and the contact layers 7. Also, the light receiving element array 1 includes a plurality of first electrodes (p side electrodes) 12 that are provided for each window layer 5 and are disposed on the insulating film 10.

Also, the light receiving element array 1 includes a second electrode (main n side electrode) 13 that is formed on the second main surface 2b of the substrate 2 and a plurality of third electrodes (sub n side electrodes) 14 that are formed on the four corner portions of the front surface of the buffer layer 3. Further, the light receiving element array 1 includes a plurality of bonding pads 15, wirings 16, and marks 17 and 18 that are formed on the insulating film 10.

In the light receiving element array 1, there is formed, in each region in which the window layer 5 is present in plan view, a light receiving element 30 that is constituted of a PIN type photodiode. In other words, in the light receiving element array 1, the light receiving element 30 is formed for each first p-type region 8. With this preferred embodiment, the light receiving element array 1 includes 16 light receiving elements 30 of four rows and four columns. Each light receiving element 30 includes the substrate 2, the buffer layer 3, the light absorbing layer 4, the window layer 5, the contact layer 7, the insulating film 10, the first electrode 12, and the second electrode 13.

In the orientation of the light receiving element array 1 shown in FIG. 1A, the four rows shall be referred to as a first, second, third, and fourth rows from an upper side of the sheet surface of FIG. 1A and the four columns shall be referred to as a first, second, third, and fourth columns from a left side of the sheet surface of FIG. 1A. Identification numbers are respectively assigned to the plurality of light receiving elements 30, for example, as follows: 1 to 4: the first column to the fourth column of the first row; 5 to 8: the first column to the fourth column of the second row; 9 to 12: the first column to the fourth column of the third row; and 13 to 16: the first column to the fourth column of the fourth row.

In this preferred embodiment, the substrate 2 is constituted of an n-type InP substrate. The n-type impurity is, for example, S (sulfur) and the impurity concentration is approximately $1 \times 10^{18}$ cm$^{-3}$ to $5 \times 10^{18}$ cm$^{-3}$. In this preferred embodiment, a thickness of the substrate 2 is approximately 180 µm. Here, the substrate 2 may instead be a semi-insulating substrate.

The buffer layer 3 is a buffer layer that buffers strain resulting from mismatch of a lattice constant of the light absorbing layer 4 formed on the buffer layer 3 and a lattice constant of the substrate 2. In this preferred embodiment, the buffer layer 3 is constituted of an n-type InP layer. The n-type impurity is, for example, Si (silicon) and the impurity concentration is approximately $1 \times 10^{18}$ cm$^{-3}$ to $5 \times 10^{18}$ cm$^{-3}$. A thickness of the buffer layer 3 is approximately 100 nm to 200 nm.

The light absorbing layer 4 has chamfered portions 4a at four corner portions. An outer side surface of each chamfered portion 4a is formed to an arcuate shape that projects inward in plan view. In this preferred embodiment, the light absorbing layer 4 is constituted of a non-doped InGaAs layer. A thickness of the light absorbing layer 4 is approximately 2 µm to 5 µm.

In this preferred embodiment, the window layers 5 are each of square shape in plan view. In this preferred embodiment, the plurality of window layers 5 are disposed in a matrix in plan view. More specifically, the plurality of window layers 5 are disposed side by side at equal intervals in the lateral direction and the longitudinal directions. In this preferred embodiment, the plurality of window layers 5 include 16 window layers 5 of four rows and four columns.

The n-type layer 6 has chamfered portions 6a at four corner portions corresponding to the four corner portions of the light absorbing layer 4. An outer side surface of each chamfered portion 6a is formed to an arcuate shape that projects inward in plan view. In this preferred embodiment, the window layers 5 and the n-type layer 6 are constituted of n-type InP layers. The n-type impurity is, for example, Si (silicon) and the impurity concentration is approximately $1 \times 10^{16}$ cm$^{-3}$ to $5 \times 10^{17}$ cm$^{-3}$. A thickness of the window layers 5 and the n-type layer 6 is approximately 0.5 µm to 1.5 µm.

The first p-type regions 8 are formed by Zn (zinc) being diffused into the window layers 5 and the light absorbing layer 4 from surfaces of the window layers 5 at an opposite side to the light absorbing layer 4. The concentration of Zn is approximately $2 \times 10^{18}$ cm$^{-3}$ at surface layer portions of the window layers 5. In this preferred embodiment, the first p-type regions 8 are of circular shapes in plan view. The first p-type regions 8 extend from the surfaces of the window layers 5 to an intermediate thickness of the light absorbing layer 4.

The second p-type region 9 is formed by Zn (zinc) being diffused into the light absorbing layer 4 from a surface of the light absorbing layer 4 at an opposite side to the substrate 2. The concentration of Zn is approximately $2 \times 10^{18}$ cm$^{-3}$ at a surface layer portion of the light absorbing layer 4. The second p-type region 9 is formed in a lattice in plan view in a central region of the light absorbing layer 4. That is, the second p-type region 9 is constituted, in plan view, of a plurality of first portions 91 that extend in the lateral direction at equal intervals in the longitudinal direction and a plurality of second portions 92 that extend in the longitudinal direction at equal intervals in the lateral direction and intersect with the plurality of first portions. The second p-type region 9 with a plurality of endless shapes (rectangular annular shapes in this example) that surround each of the respective window layers 5 in plan view is formed by the plurality of first portions 91 and the plurality of second portions 92.

In this preferred embodiment, the second p-type region 9 extends from the surface of the light absorbing layer 4 to an intermediate thickness of the light absorbing layer 4. Here, the second p-type region 9 may penetrate through the light absorbing layer 4 from the surface of the light absorbing layer 4 and reach the buffer layer 3 as indicated by alternate long and two short dashed lines 9A in FIG. 2.

In this preferred embodiment, the contact layers 7 are constituted of p-type InGaAs layers. The p-type impurity is, for example, Zn (zinc) and the impurity concentration is approximately $1 \times 10^{19}$ cm$^{-3}$ to $2 \times 10^{19}$ cm$^{-3}$. A thickness of the contact layers 7 is approximately 100 nm. The contact layers 7 are of endless shapes (circular annular shapes in this example) in plan view and are formed on peripheral edge portions of front surfaces of the first p-type regions 8. That is, lower surfaces of the contact layers 7 contact the front surfaces of the first p-type regions 8.

The insulating film 10 covers the exposed surface of the light absorbing layer 4, the exposed surfaces of the window layer 5, the exposed surface of the n-type layer 6, and the contact layers 7. Further, the insulating film 10 covers portions of exposed surfaces of the respective corner portions of the buffer layer 3 in vicinities of the chamfered portions 4a of the light absorbing layer 4. Contact holes 11 of circular annular shapes in plan view that expose width direction intermediate portions of front surfaces of the contact layers 7 of circular annular shape in plan view across entire circumferences are formed in the insulating film 10. Chamfered portions 10a are formed at four corner portions of the insulating film 10. An outer side surface of each chamfered portion 10a is formed to an arcuate shape that projects inward in plan view.

In this preferred embodiment, the insulating film 10 is constituted of an SiN film. In this preferred embodiment, a thickness of the insulating film 10 is set to approximately 200 nm such as to prevent reflection of light of a wavelength of 1500 nm. That is, in this preferred embodiment, the insulating film 10 is an antireflection film that prevents reflection of light of a predetermined wavelength. The thickness of the insulating film 10 is set according to the wavelength of the light the reflection of which is to be prevented. The wavelength of the light the reflection of which is to be prevented is set in advance.

The first electrodes 12 are of endless shapes (circular annular shapes in this example) in plan view and are formed on the insulating film 10 such as to cover the contact holes 11. A portion of each first electrode 12 enters into the contact hole 11 and contacts the front surface of the contact layer 7 inside the contact hole 11. The first electrodes 12 are thereby electrically connected to the first p-type regions 8 via the contact layers 7. In this preferred embodiment, the first electrodes 12 are each constituted of a laminated Ti/Pt/Au film in which a Ti film, a Pt film, and an Au film are laminated in that order from a lower layer.

The second electrode 13 is electrically connected to the buffer layer 3 via the substrate 2. In this preferred embodiment, the second electrode 13 is constituted of a laminated Ti/Pt/Au film in which a Ti film, a Pt film, and an Au film are laminated in that order on the second main surface 2b of the substrate 2.

The third electrodes 14 are respectively formed on the exposed surfaces of the four corner portions of the buffer layer 3. That is, the third electrodes 14 are electrically connected to the buffer layer 3. The third electrodes 14 may be used to examine characteristics of the light receiving elements 30 in a manufacturing process of the light receiving element array 1. In this preferred embodiment, the third electrodes 14 are each constituted of a laminated Ti/Pt/Au film in which a Ti film, a Pt film, and an Au film are laminated in that order from a lower layer.

The plurality of bonding pads 15 are formed on peripheral edge portions of a front surface of the insulating film 10. Specifically, four each of the bonding pads 15 are formed respectively in edge portions corresponding to respective sides of the insulating film 10. Also, the plurality of wirings 16 that respectively connect the first electrodes 12 of the plurality of light receiving elements 30 to respectively different bonding pads 15 are formed on the front surface of the insulating film 10.

Further, the single first mark 17 of a + (plus sign) shape in plan view and the three second marks 18 of L shapes in plan view are formed on the front surface of the insulating film 10 such as to enable recognition of identification numbers of the respective light receiving elements 30. In this preferred embodiment, the first mark 17 is formed near an upper left corner portion of the front surface of the insulating film 10 and the second marks are respectively formed near other three corner portions of the front surface of the insulating film 10. By these marks 17 and 18, it is made possible to recognize the identification numbers assigned to the plurality of light receiving elements 30.

In this preferred embodiment, the bonding pads 15, the wirings 16, and the marks 17 and 18 are constituted of the same materials as the electrodes 12 and 14. As shall be described below, the bonding pads 15, the wirings 16, and the marks 17 and 18 are prepared in the same step as the first electrodes 12 and the third electrodes 14.

The light receiving element array 1 is used in a state where an external wiring is connected between the respective bonding pads 15 and the second electrode 13. A power source for generating an internal electric field in the light absorbing layer 4 is connected to the external wiring. When light is made incident on the light absorbing layer 4 from upper surfaces of the light receiving elements 30, electrons and holes are generated inside the light absorbing layer 4. The electrons generated inside the light absorbing layer 4 move to the second electrode 13 side due to the internal electric field and the holes generated inside the light absorbing layer 4 move to the first electrode 12 side due to the internal electric field. Thereby, an electric current flows to an external circuit.

In the first preferred embodiment, the second p-type region 9 is formed in the light absorbing layer 4 such as to surround each of the plurality of window layers 5 (light receiving elements 30) in plan view. Thereby, when light is made incident on a certain light receiving element 30, the electrons and holes generated inside the light absorbing layer 4 of the certain light receiving element 30 can be suppressed from moving to an adjacent light receiving element 30. Crosstalk can thereby be reduced. The crosstalk refers to a phenomenon where, due to light made incident on a certain light receiving element, an electric current leaks to an adjacent light receiving element.

Figure 2:
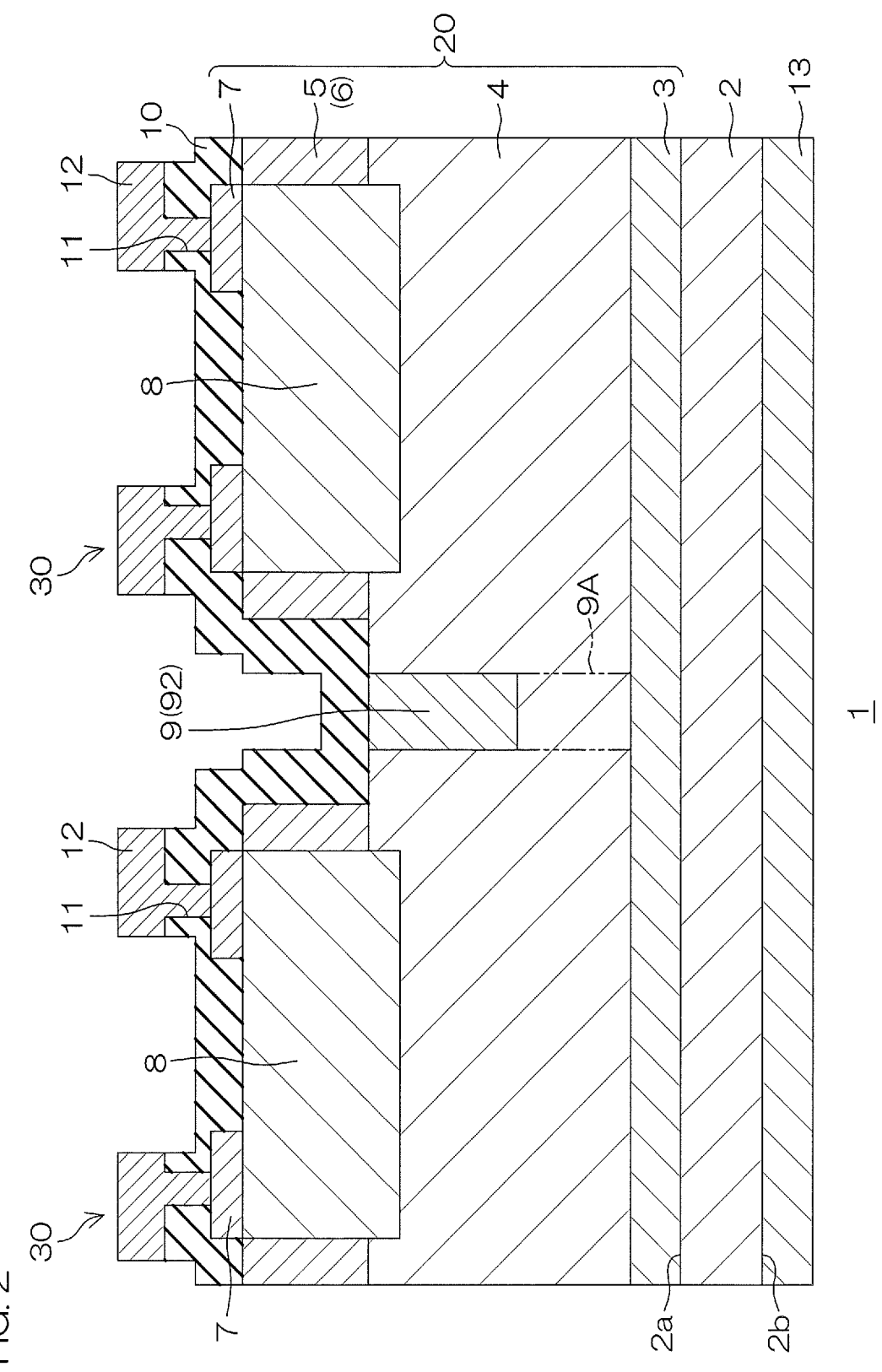
FIG. 2 is a diagrammatic sectional view taken along line II-II of FIG. 1B.
Figure 4:
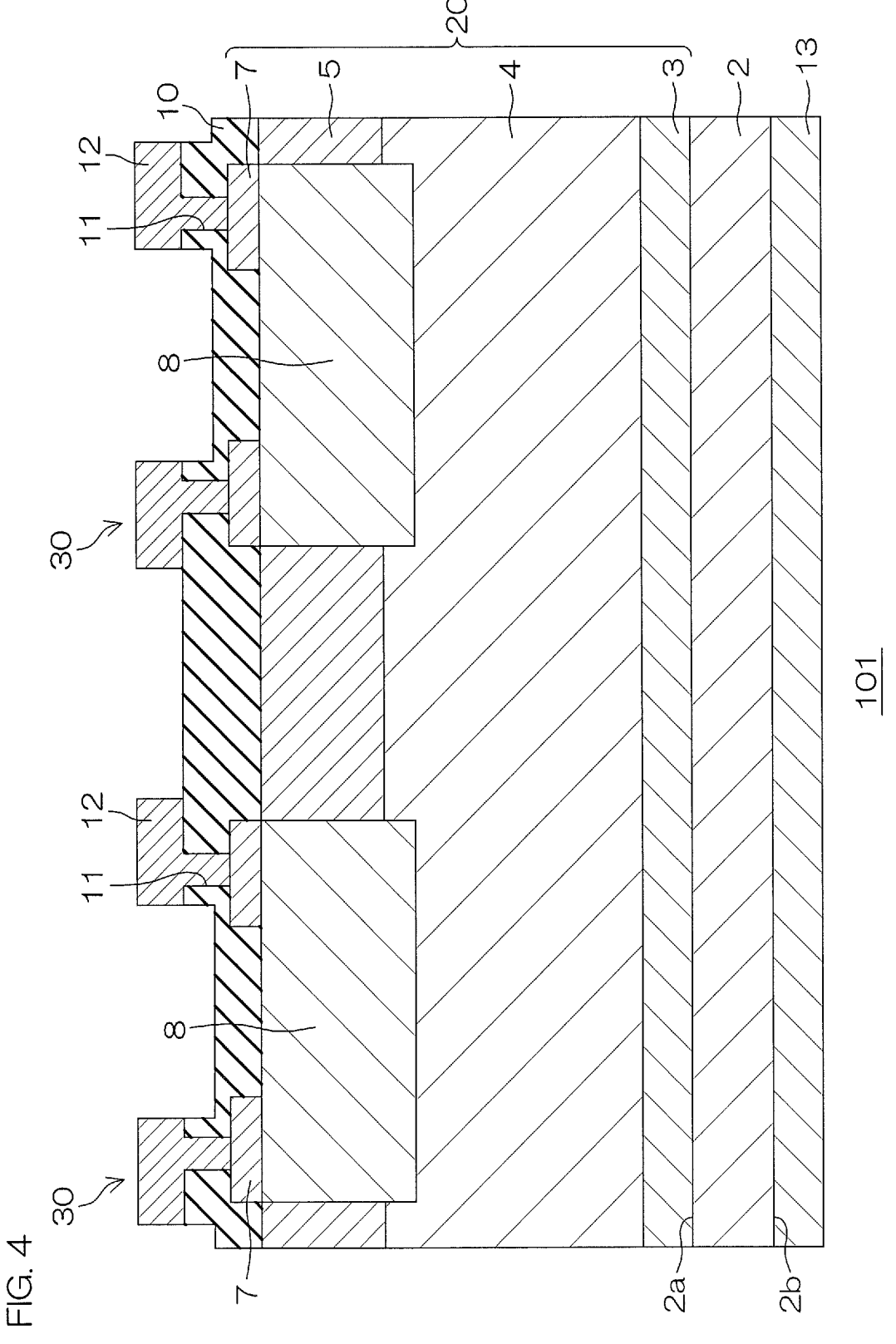
FIG. 4 is a sectional view showing a light receiving element array in which, in contrast to the light receiving element array shown in FIG. 1 to FIG. 3, a window layer is formed integrally across substantially an entirety of a front surface of a light absorbing layer and a second p-type region is not formed inside the light absorbing layer.

FIG. 4 shows a light receiving element array 101 in which, in contrast to the light receiving element array 1 shown in FIG. 1 to FIG. 3, a window layer 5 is formed integrally across substantially an entirety of the front surface of the light absorbing layer 4 and the second p-type region 9 is not formed inside the light absorbing layer 4. Even in the light receiving element array 101, the light receiving elements 30 are formed for each first p-type region 8. In FIG. 4, portions corresponding to respective portions of FIG. 2 described above are indicated with the same reference signs attached as in FIG. 2.

In the following, a sample of the light receiving element array 101 shown in FIG. 4 is referred to at times as a first sample. Also, a sample of the light receiving element array 1 shown in FIG. 1 to FIG. 3 is referred to at times as a second sample.

With each of the first sample and the second sample, an electric current (hereinafter referred to as the "first electric current I1") that flows through a certain light receiving element 30 when light of 1 mW is made incident on the certain light receiving element, an electric current (hereinafter referred to as the "second electric current I2") that flows through a light receiving element adjacent to a certain light receiving element when light of 1 mW is made incident on the certain light receiving element, and a dark current were measured. The dark current is an electric current that flows through a light receiving element when light is not made incident on the light receiving element.

Figure 5:
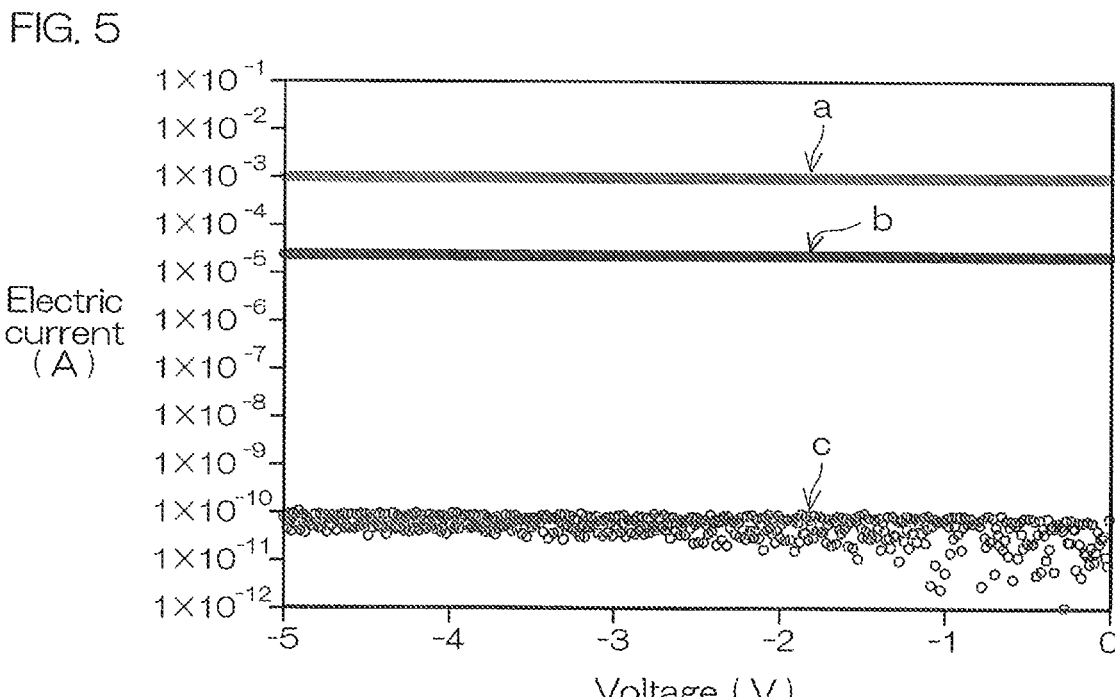
FIG. 5 is a graph showing measurement results for a first sample that is a sample of the light receiving element array shown in FIG. 4.
Figure 6:
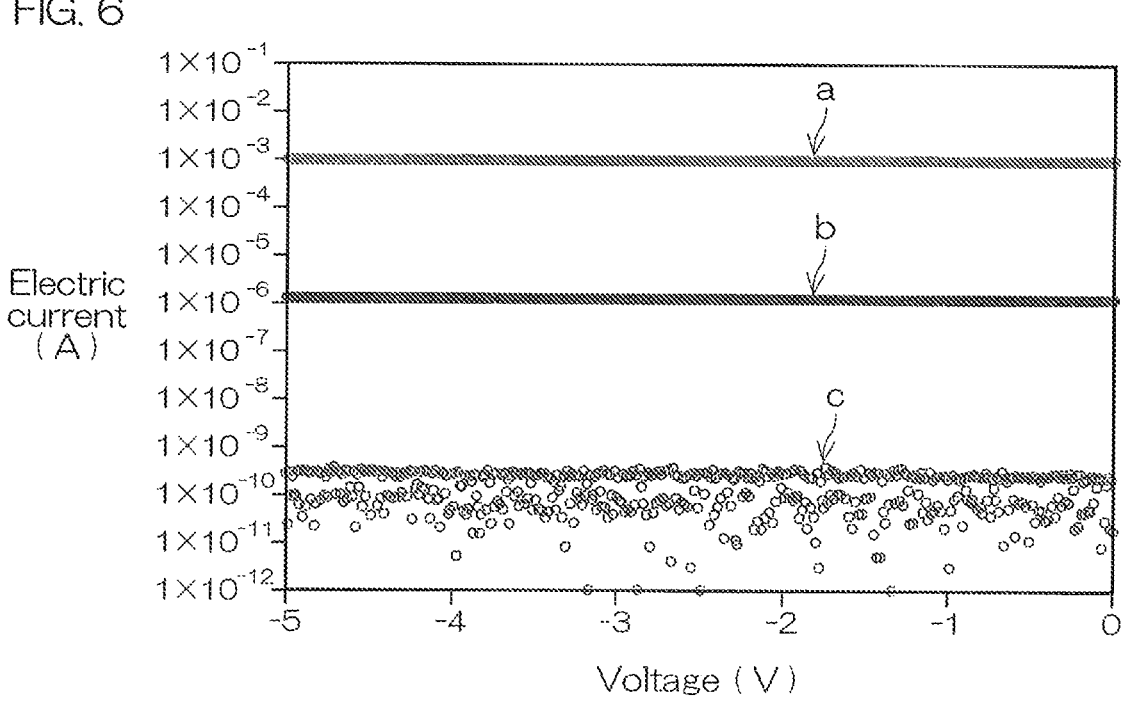
FIG. 6 is a graph showing measurement results for a second sample that is a sample of the light receiving element array shown in FIG. 1A to FIG. 3.

FIG. 5 is a graph showing measurement results for the first sample and FIG. 6 is a graph showing measurement results for the second sample. In FIG. 5 and FIG. 6, a straight line a represents a graph of the first current I1, a straight line b represents a graph of the second current I2, and a dot group c of circular points represents a graph of the dark current.

From FIG. 5 and FIG. 6, it can be understood that with the second sample, the second current is greatly lowered in comparison to the first sample. Also, if $\{(I2/I1)\times100\}$ is deemed to be a crosstalk characteristic [%], whereas the crosstalk characteristic was 2.32% with the first sample, the crosstalk characteristic was 0.13% with the second sample. That is, it can be understood that with the second sample, the crosstalk is greatly decreased in comparison to the first sample. It can also be understood that with the second sample, the dark current is reduced in comparison to the first sample.

FIG. 7A to FIG. 7K are sectional views for describing an example of a manufacturing process of the light receiving element array 1 described above and are sectional views corresponding to a section plane of FIG. 2. FIG. 8A to FIG. 8K are sectional views for describing the example of the manufacturing process of the light receiving element array 1 described above and are sectional views corresponding to a section plane of FIG. 3.

Figure 7A:
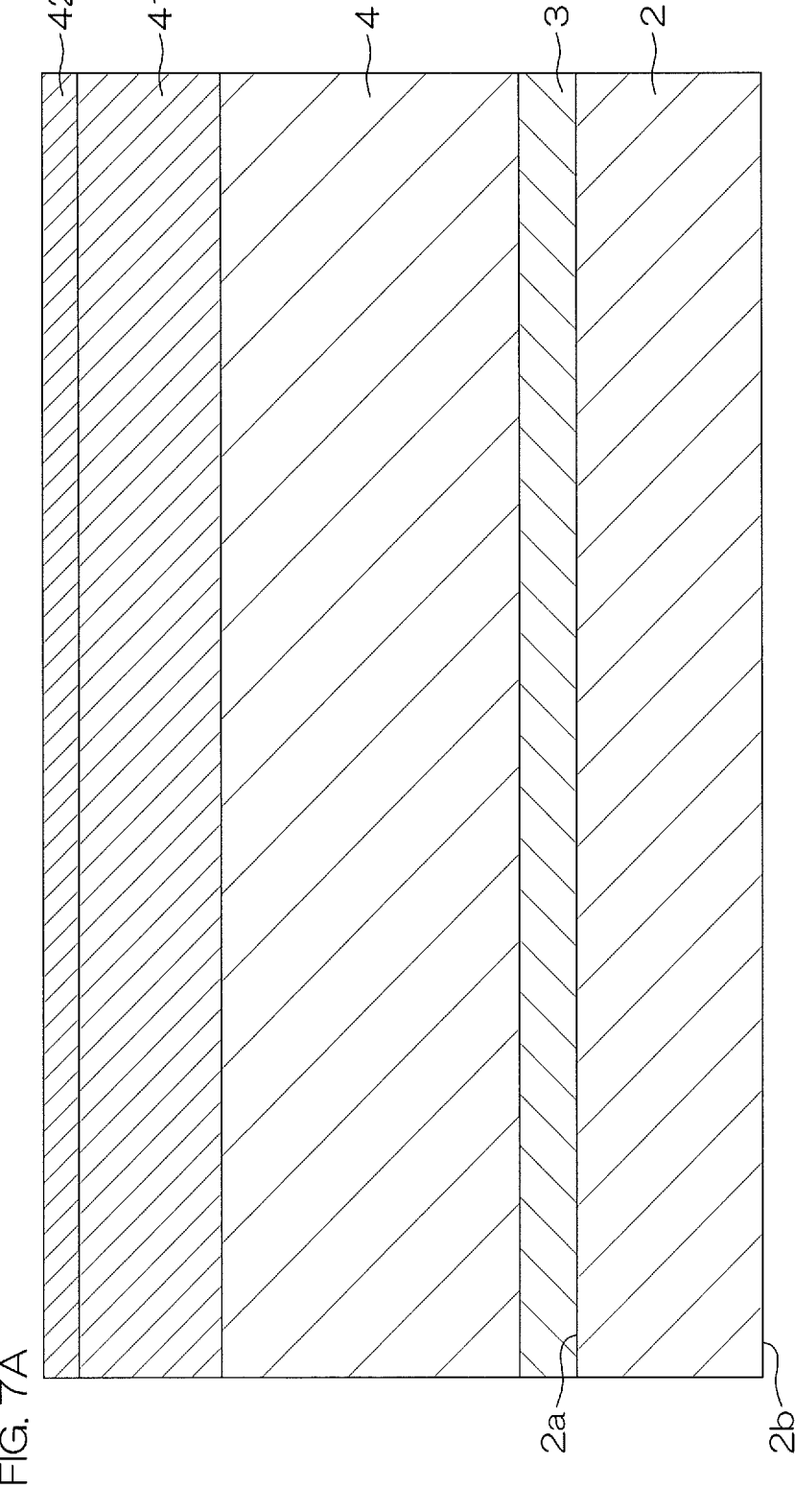
FIG. 7A is a sectional view showing an example of a manufacturing process of the light receiving element array shown in FIG. 1A to FIG. 3 and is a sectional view corresponding to a section plane of FIG. 2.
Figure 8A:
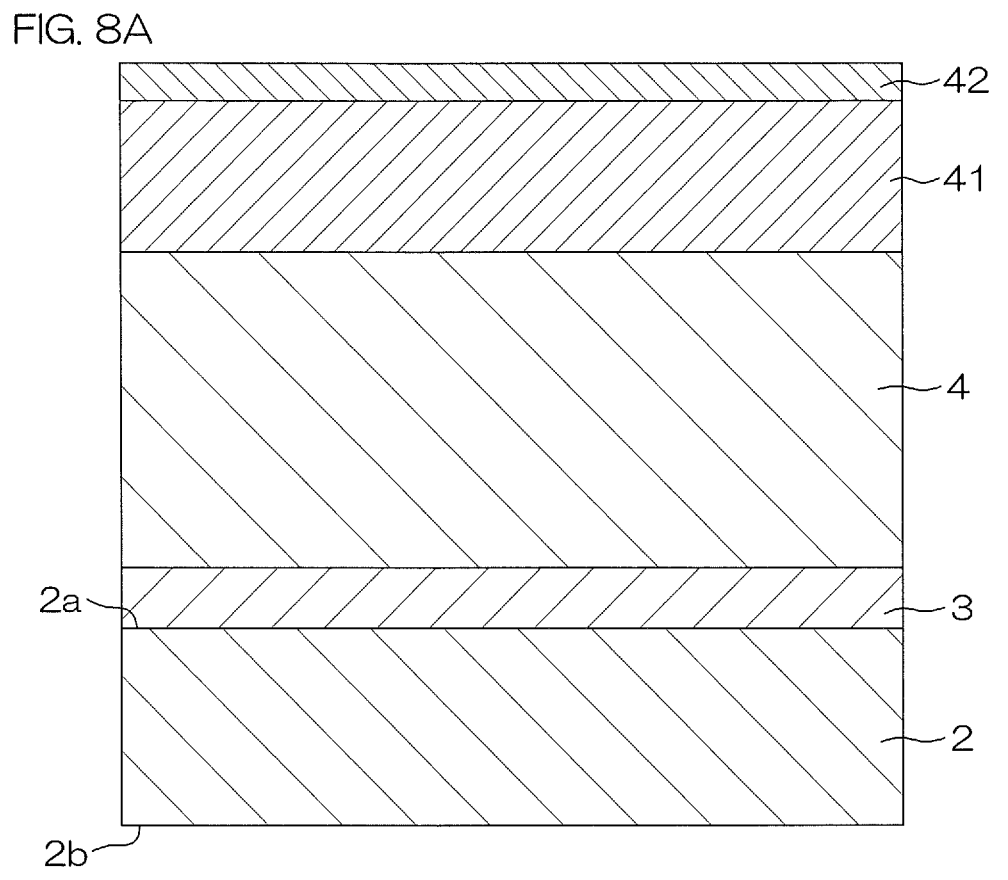

First, as shown in FIG. 7A and FIG. 8A, the buffer layer (for example, the n-type InP layer) 3 and the light absorbing layer (for example, the InGaAs layer) 4 are epitaxially grown successively on the first main surface 2a of the substrate (for example, n-type InP substrate) 2 by, for example, an MOCVD (metal organic chemical vapor deposition) method. Further, a window material layer (for example, an n-type InP layer) 41 that is a material layer of the window layers 5 and the n-type layer 6 and a contact material layer (for example, p-type InGaAs layer) 42 that is a material layer of the contact layers are epitaxially grown successively on the light absorbing layer 4 by the MOCVD method. As the substrate 2, that which is thicker than the thickness of the substrate 2 at a final stage is used.

Figure 7B:
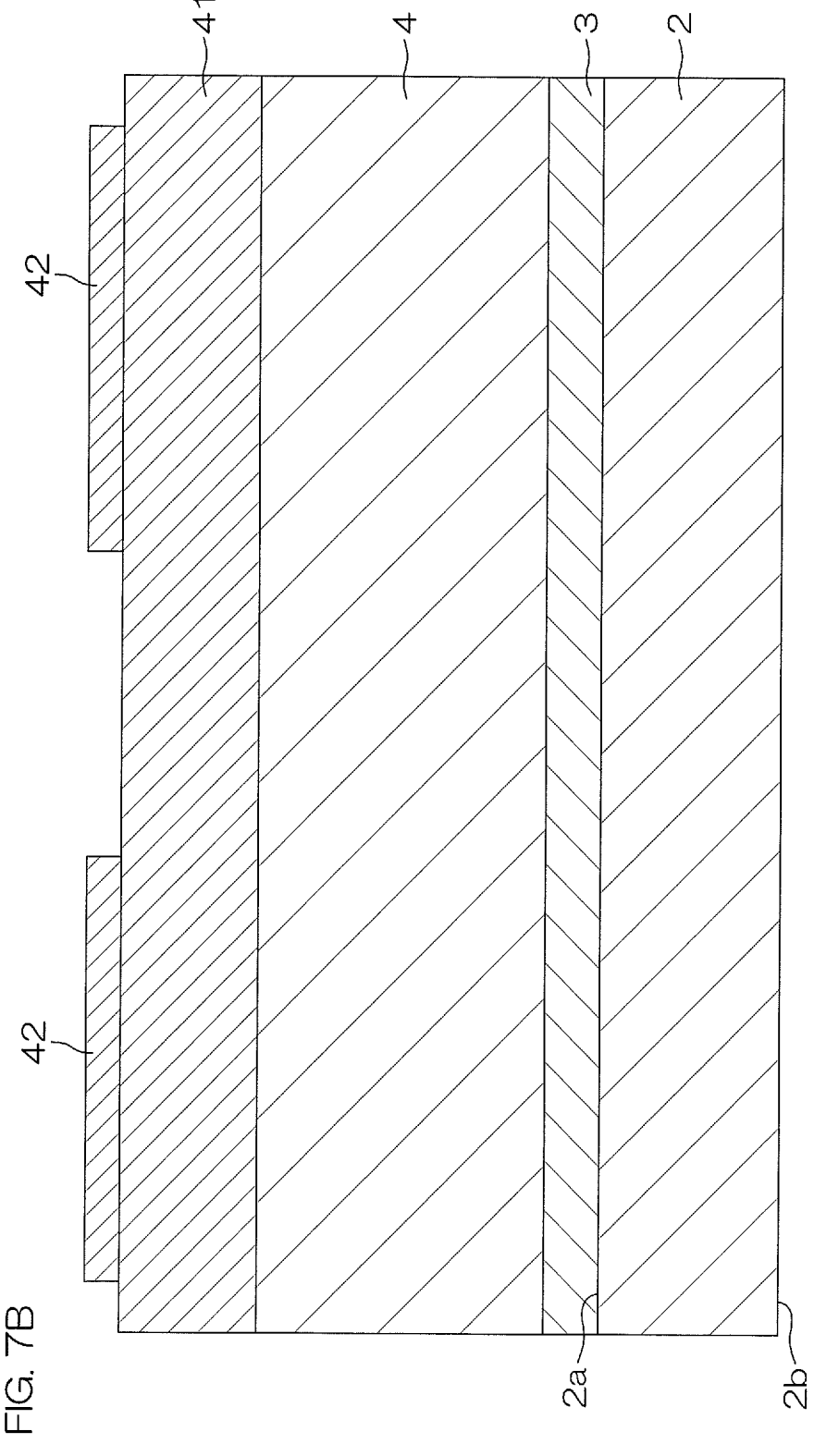
FIG. 7B is a sectional view showing a step subsequent to that of FIG. 7A.
Figure 8B:
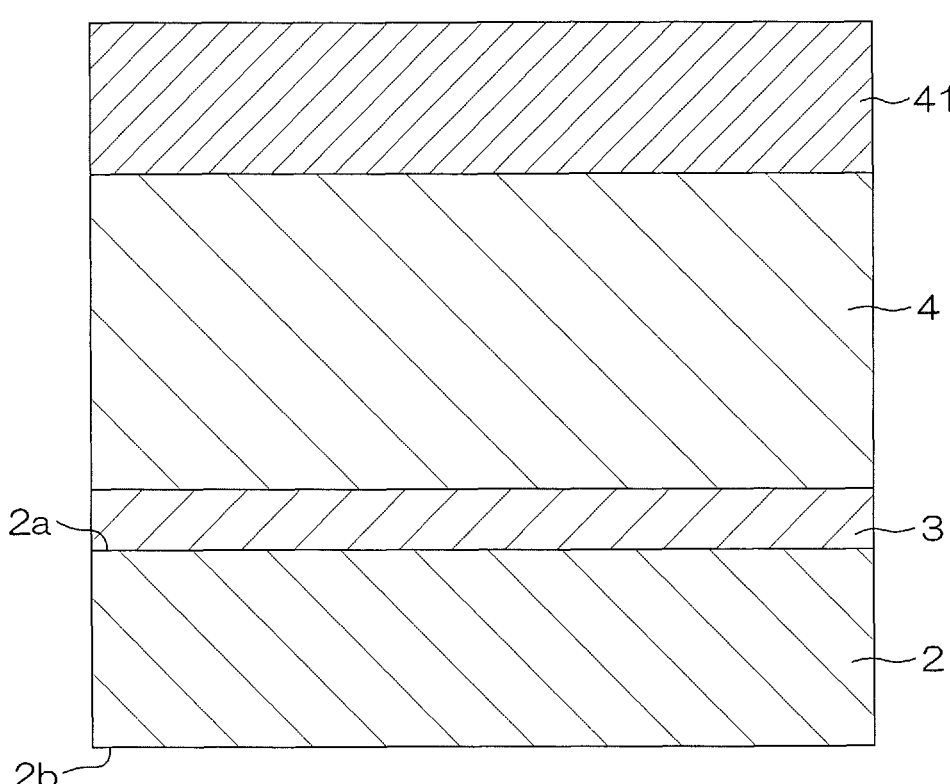
FIG. 8B is a sectional view showing a step subsequent to that of FIG. 8A.

Next, as shown in FIG. 7B and FIG. 8B, regions of the contact material layer 42 other than regions corresponding to being regions in which the first p-type regions 8 are to be formed are removed by photolithography and etching. Thereby, the contact material layers 42 remain just in regions of a window material layer 41 front surface in which the first p-type regions 8 are to be formed.

Figure 7C:
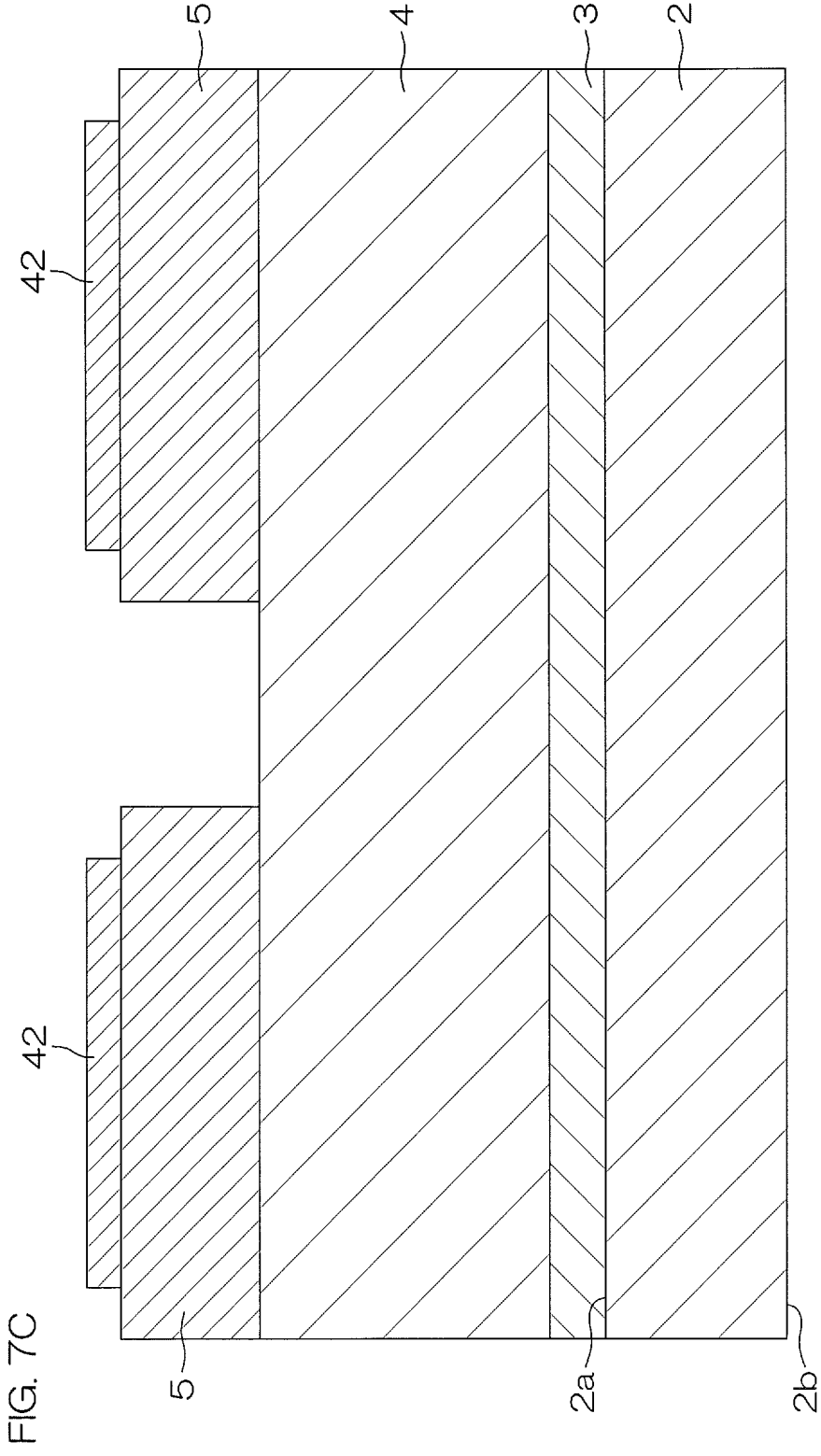
FIG. 7C is a sectional view showing a step subsequent to that of FIG. 7B.
Figure 8C:
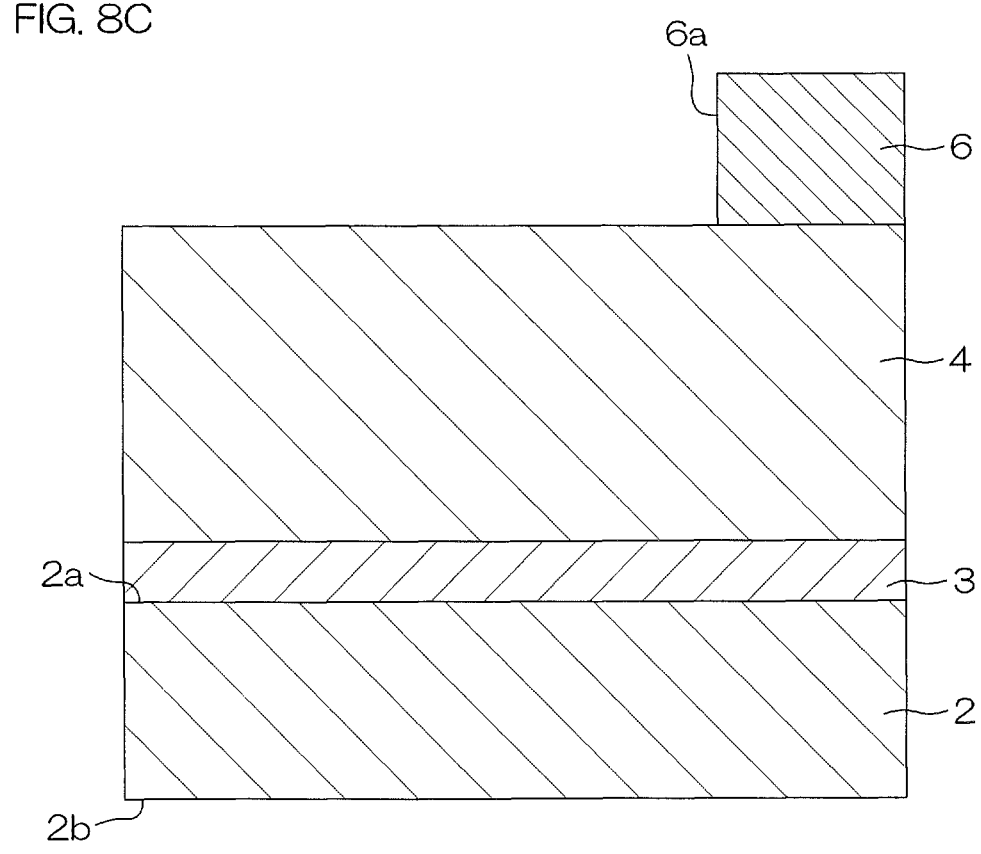
FIG. 8C is a sectional view showing a step subsequent to that of FIG. 8B.

Next, as shown in FIG. 7C and FIG. 8C, the window material layer 41 is patterned by photolithography and etching. The plurality of window layers 5 and the n-type layer 6 are thereby formed on the light absorbing layer 4. The plurality of window layers 5 are formed such as to be disposed in a matrix in the central portion region of the front surface of the light absorbing layer 4. The n-type layer 6 is formed on the peripheral edge portion of the front surface of the light absorbing layer 4 excluding the four corner portions such as to surround the window layer group. The n-type layer 6 having the chamfered portions 6a at corner portions corresponding to the four corner portions of the light absorbing layer 4 is thereby obtained.

Figure 7D:
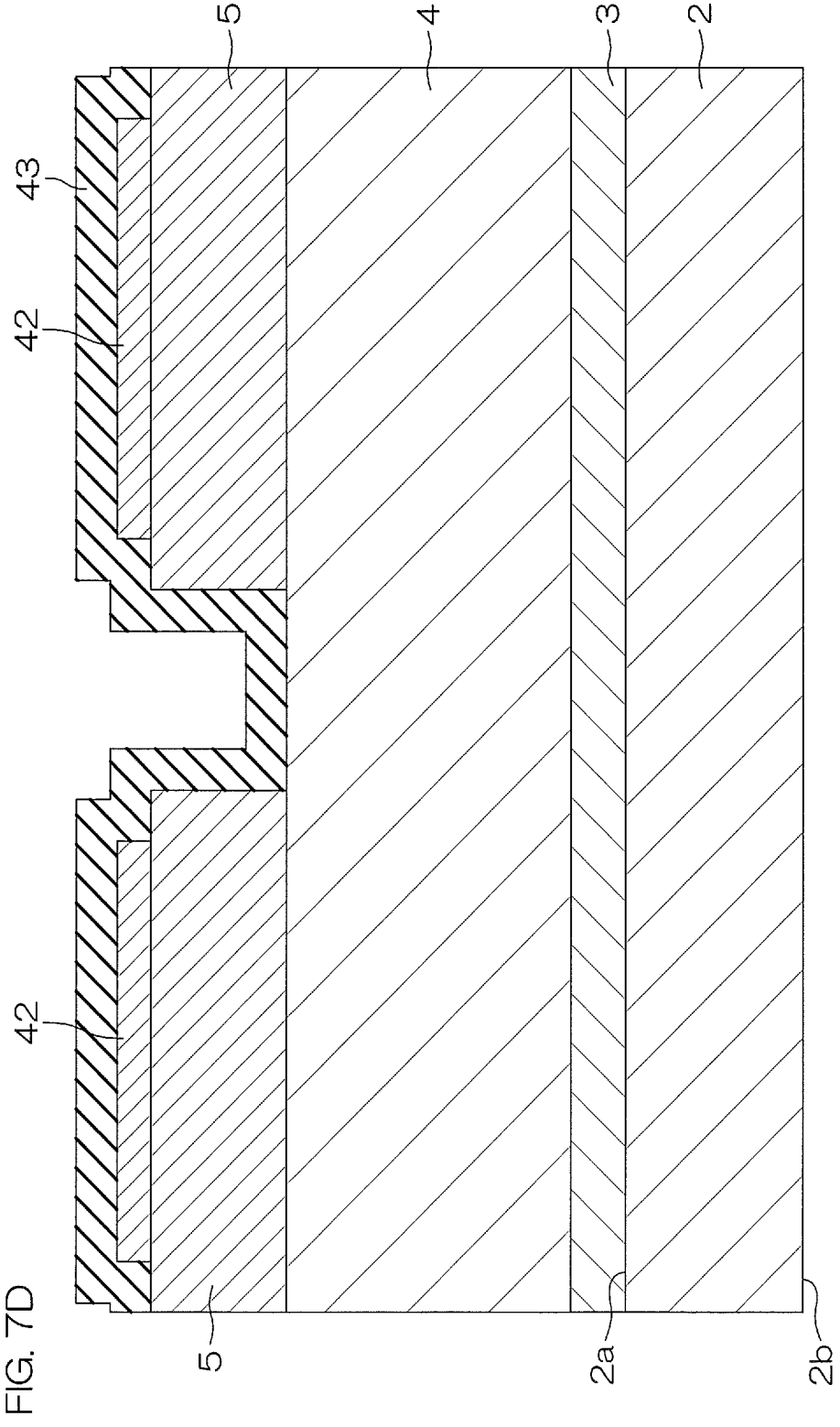
FIG. 7D is a sectional view showing a step subsequent to that of FIG. 7C.
Figure 8D:
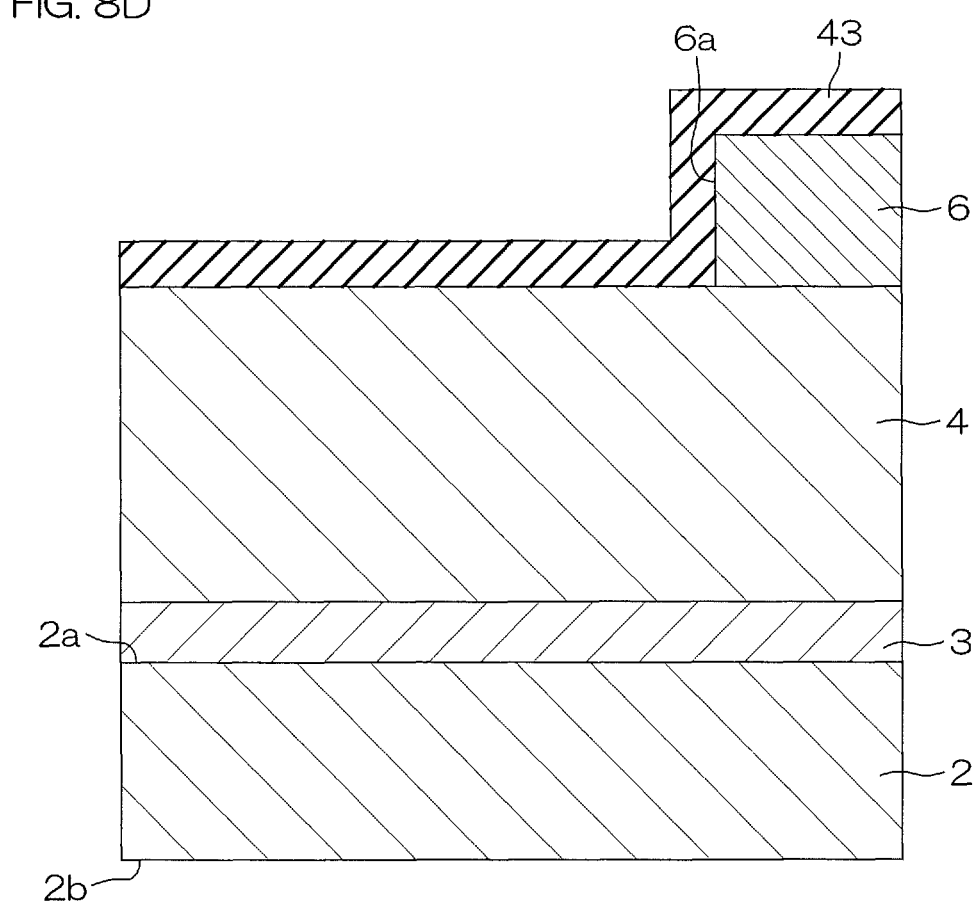
FIG. 8D is a sectional view showing a step subsequent to that of FIG. 8C.

Next, as shown in FIG. 7D and FIG. 8D, an insulating film 43 for masking is formed over all exposed front surfaces by a plasma CVD method, LPCVD (low pressure CVD) method, MOCVD method, sputtering method, etc.

Figure 7E:
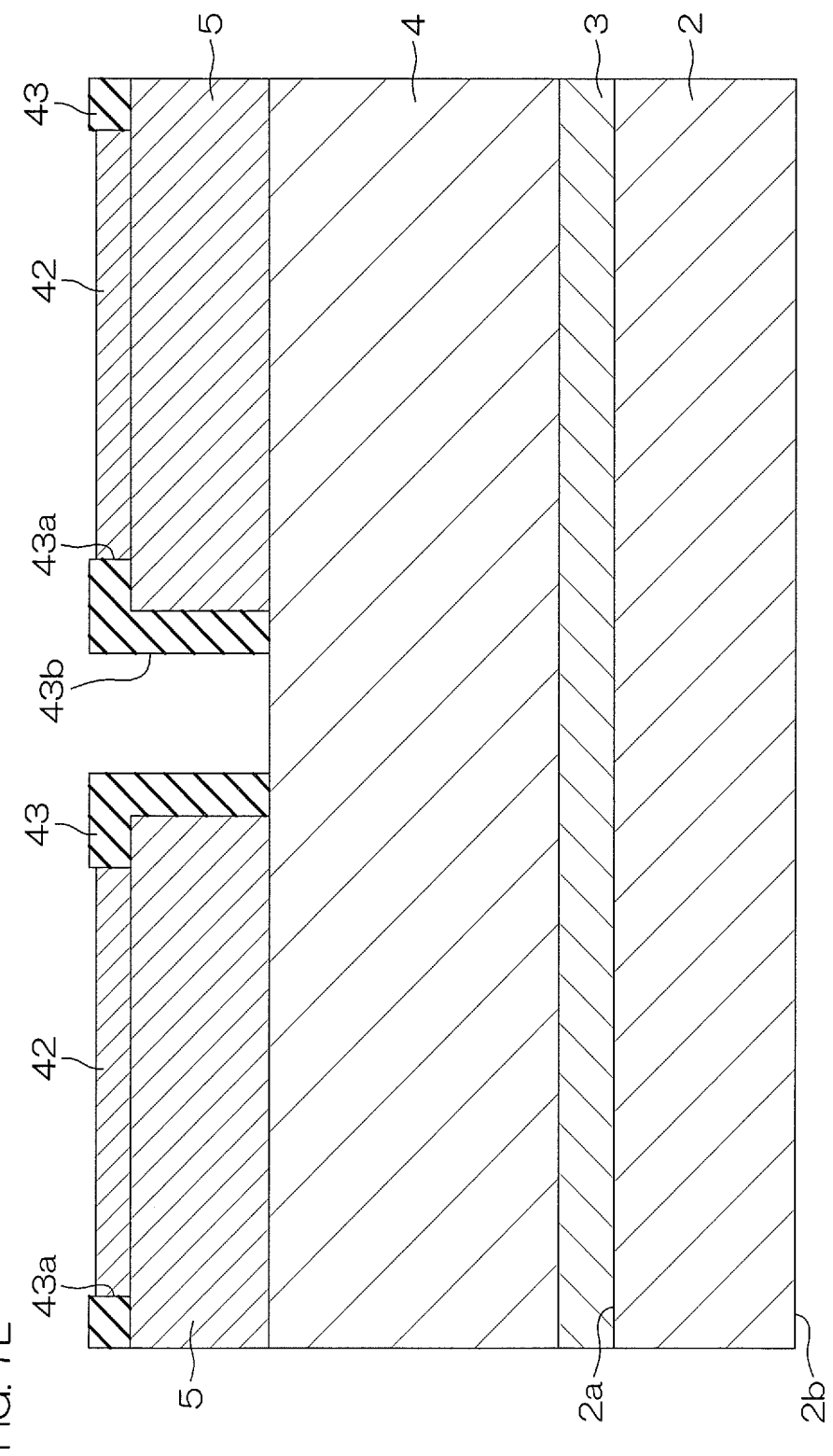
FIG. 7E is a sectional view showing a step subsequent to that of FIG. 7D.
Figure 8E:
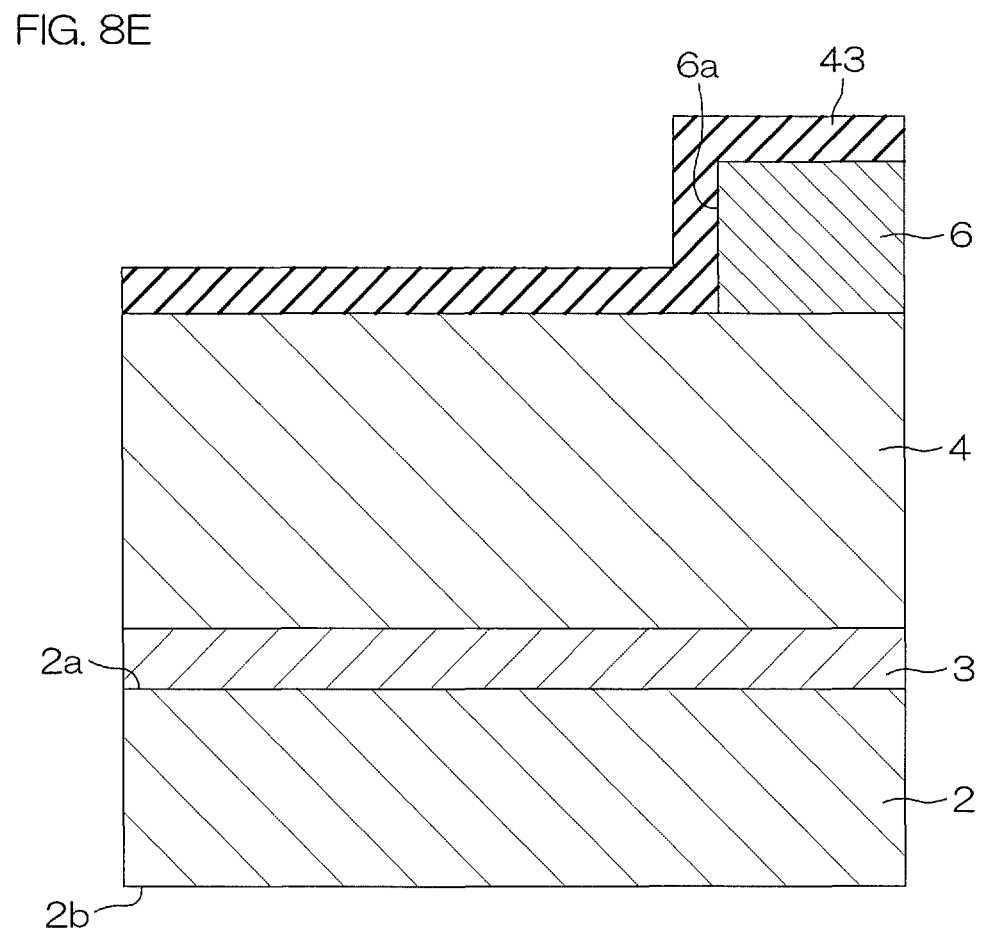
FIG. 8E is a sectional view showing a step subsequent to that of FIG. 8D.

Next, as shown in FIG. 7E and FIG. 8E, from the insulating film 43, portions covering front surfaces (upper surfaces) of the contact material layers 42 and a portion covering a region of the front surface of the light absorbing layer 4 in which the second p-type region 9 is to be formed are removed by photolithography and etching. First opening portions 43a for forming the first p-type regions 8 and a second opening portion 43b for forming the second p-type region 9 are thereby formed in the insulating film 43.

Figure 7F:
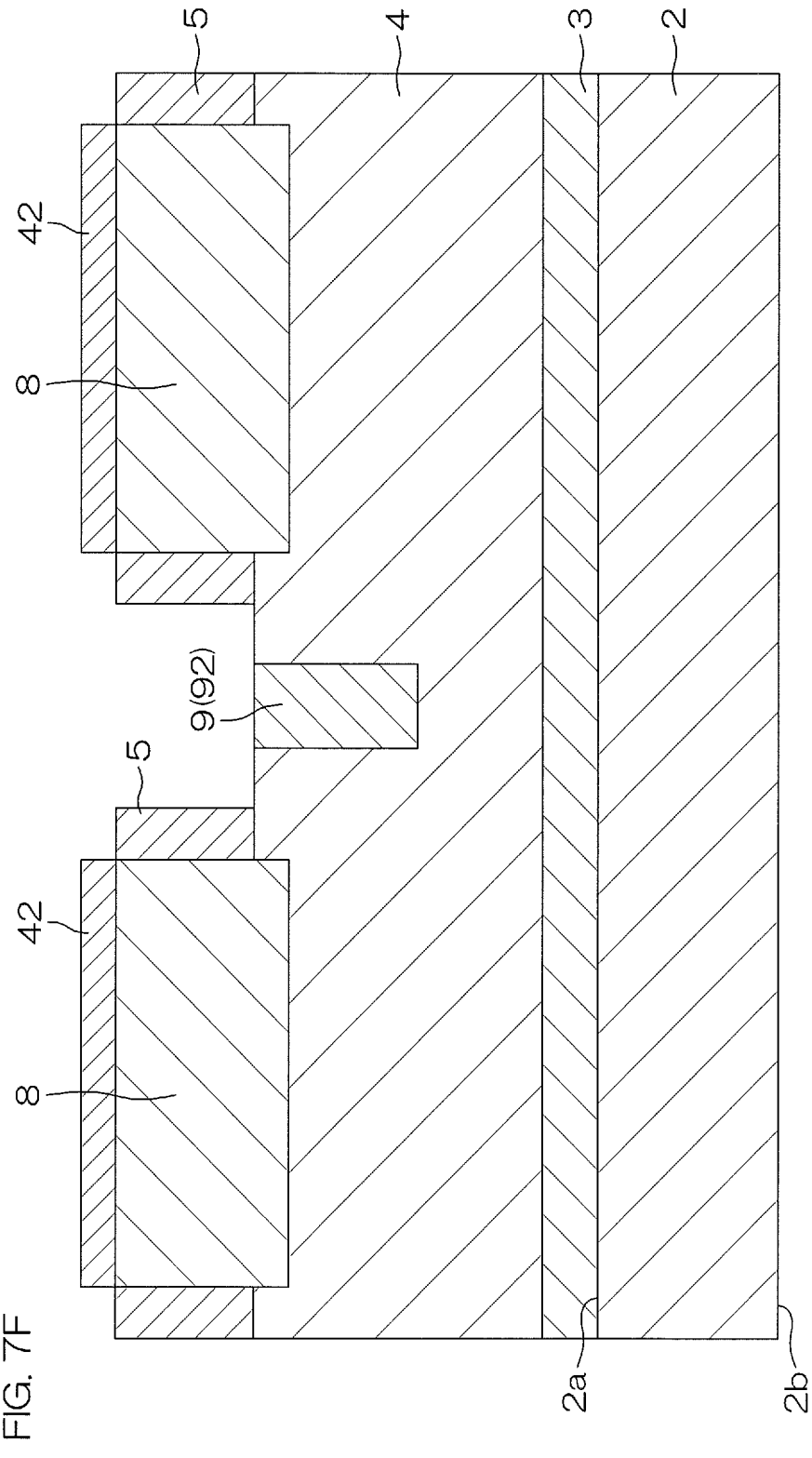
FIG. 7F is a sectional view showing a step subsequent to that of FIG. 7E.
Figure 8F:
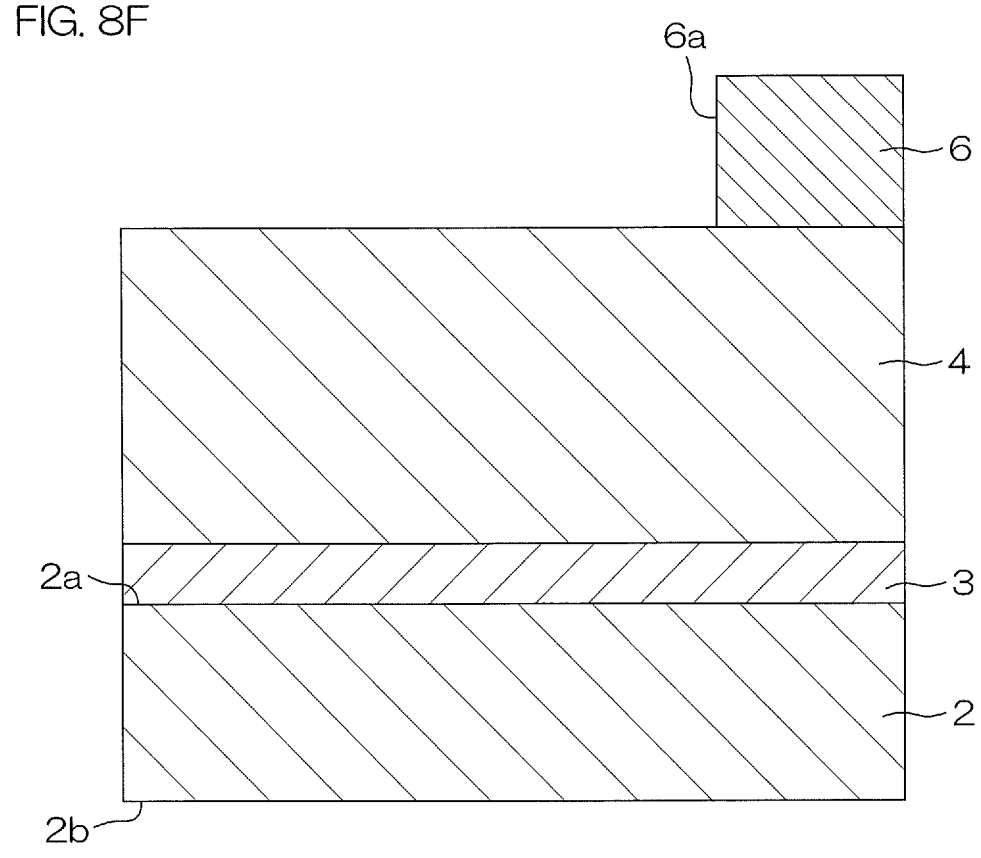
FIG. 8F is a sectional view showing a step subsequent to that of FIG. 8E.

Next, as shown in FIG. 7F and FIG. 8F, the insulating film 43 is used as a mask to make Zn diffuse into the contact material layers 42, the window layers 5, and the light absorbing layer 4 via the first opening portions 43a and make Zn diffuse into the light absorbing layer 4 via the second opening portion 43b. The first p-type regions 8 are thereby formed inside the window layers 5 and the light absorbing layer 4 and the second p-type region 9 is formed inside the light absorbing layer 4. Thereafter, the insulating film 43 is removed.

Figure 7G:
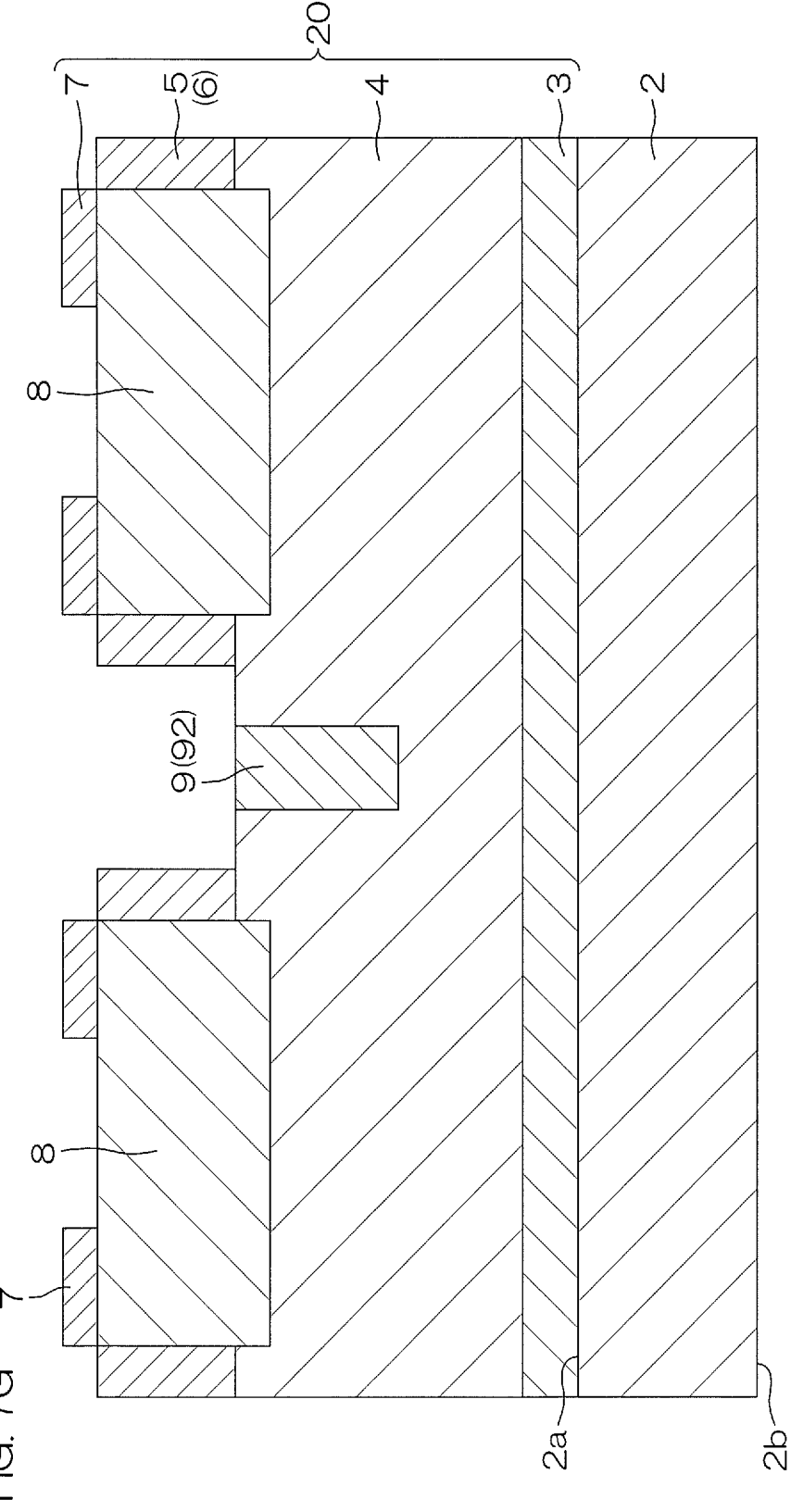
FIG. 7G is a sectional view showing a step subsequent to that of FIG. 7F.
Figure 8G:
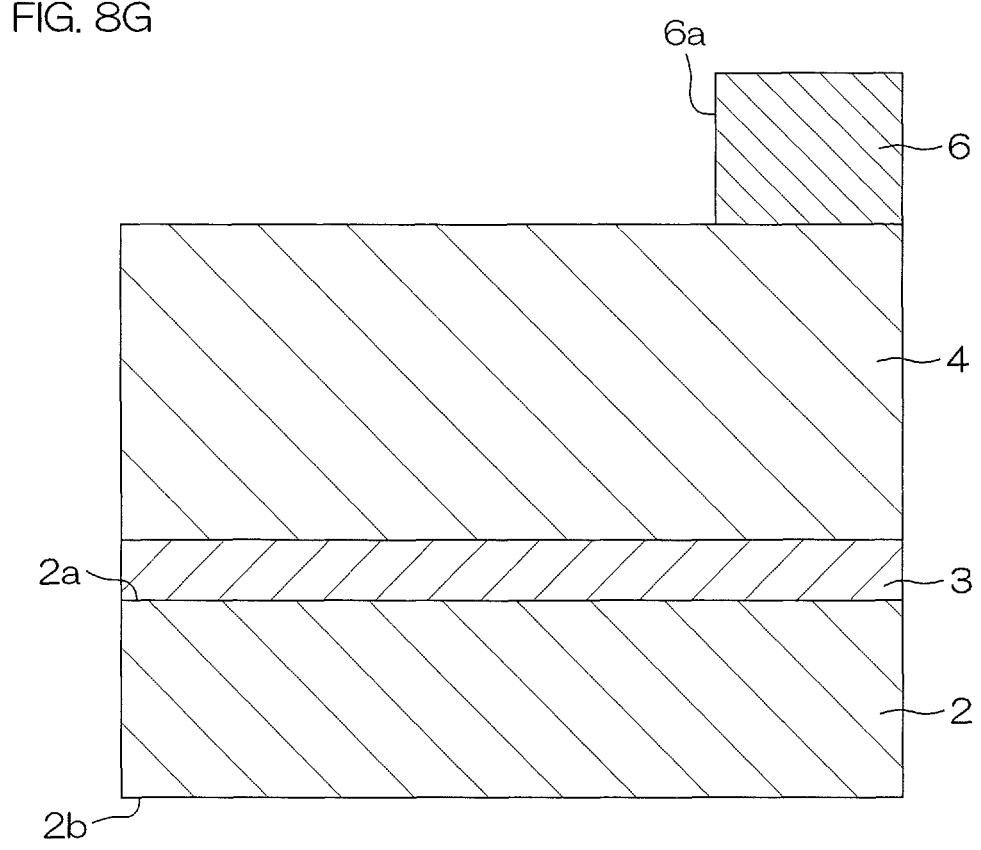
FIG. 8G is a sectional view showing a step subsequent to that of FIG. 8F.

Next, as shown in FIG. 7G and FIG. 8G, the contact material layers 42 are patterned by photolithography and etching. The contact layers 7 of circular annular shapes in plan view that contact the peripheral edge portions of first p-type region 8 front surfaces are thereby formed on the respective window layers 5. The laminated semiconductor structure 20 that includes the buffer layer 3, the light absorbing layer 4, the window layers 5, the n-type layer 6, and the contact layers 7 is thereby obtained.

Figure 7H:
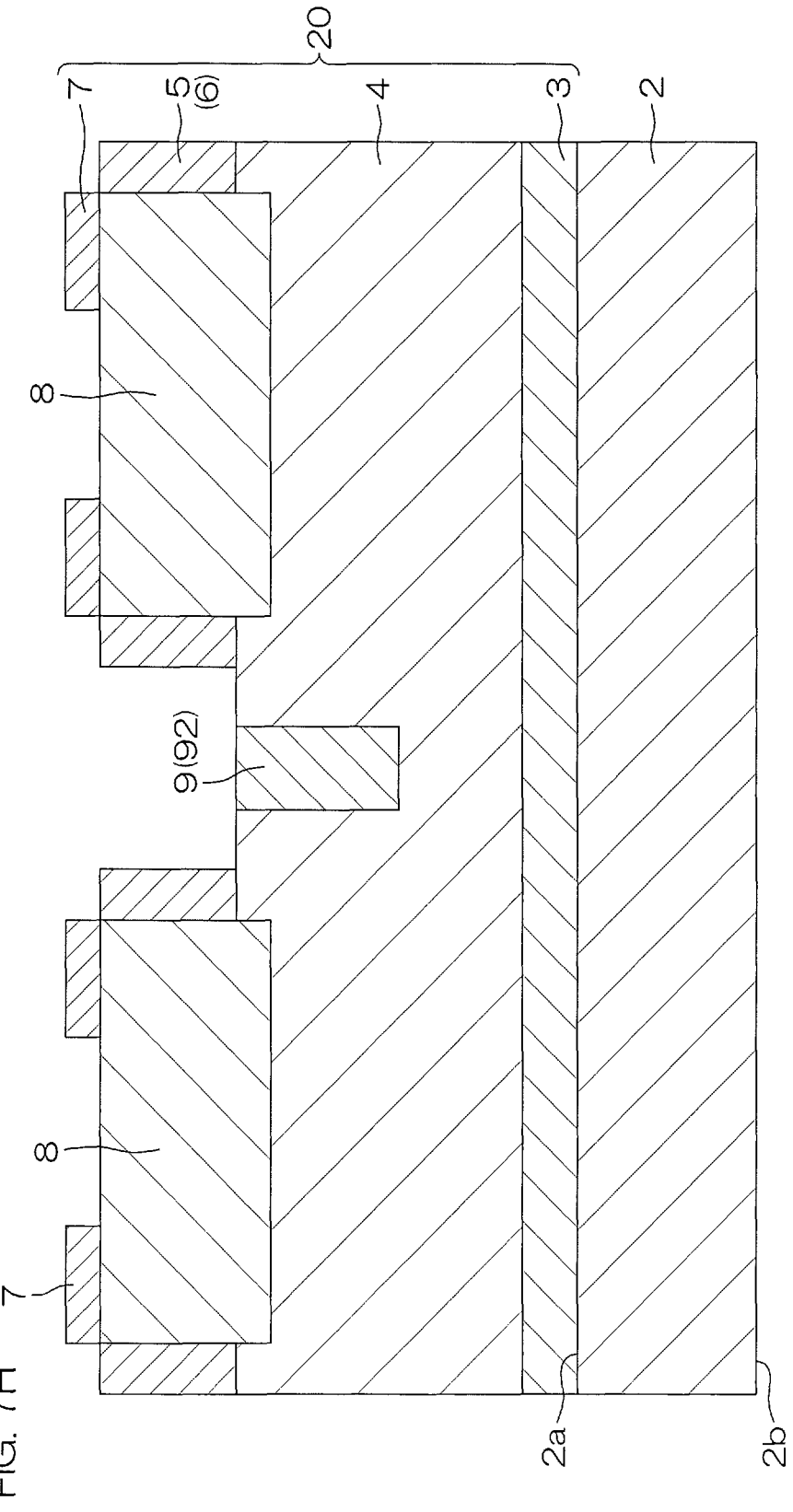
FIG. 7H is a sectional view showing a step subsequent to that of FIG. 7G.
Figure 7:
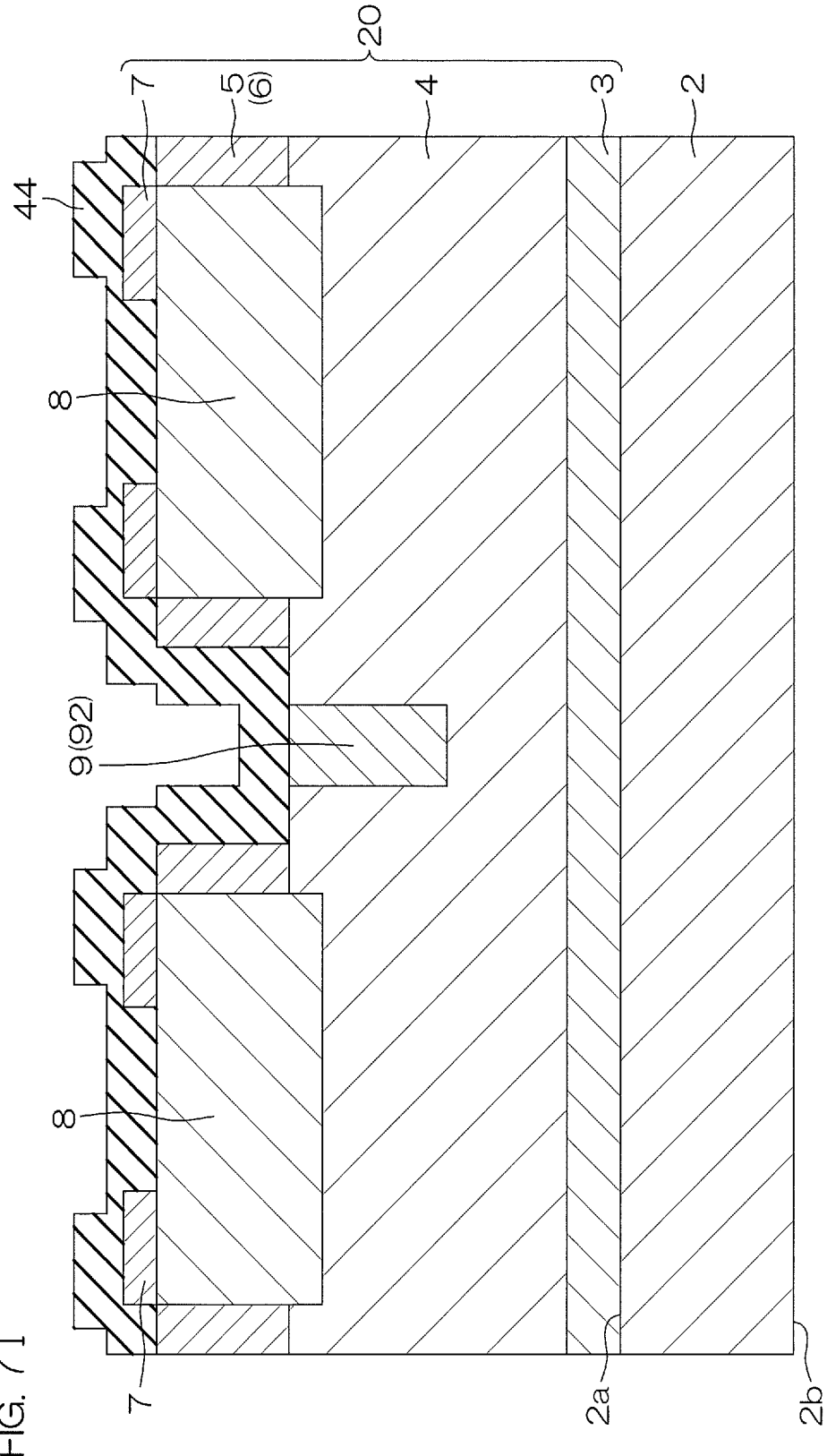
FIG. 7I is a sectional view showing a step subsequent to that of FIG. 7H.
FIG. 7J is a sectional view showing a step subsequent to that of FIG. 7I.
FIG. 7K is a sectional view showing a step subsequent to that of FIG. 7J.
Figure 8H:
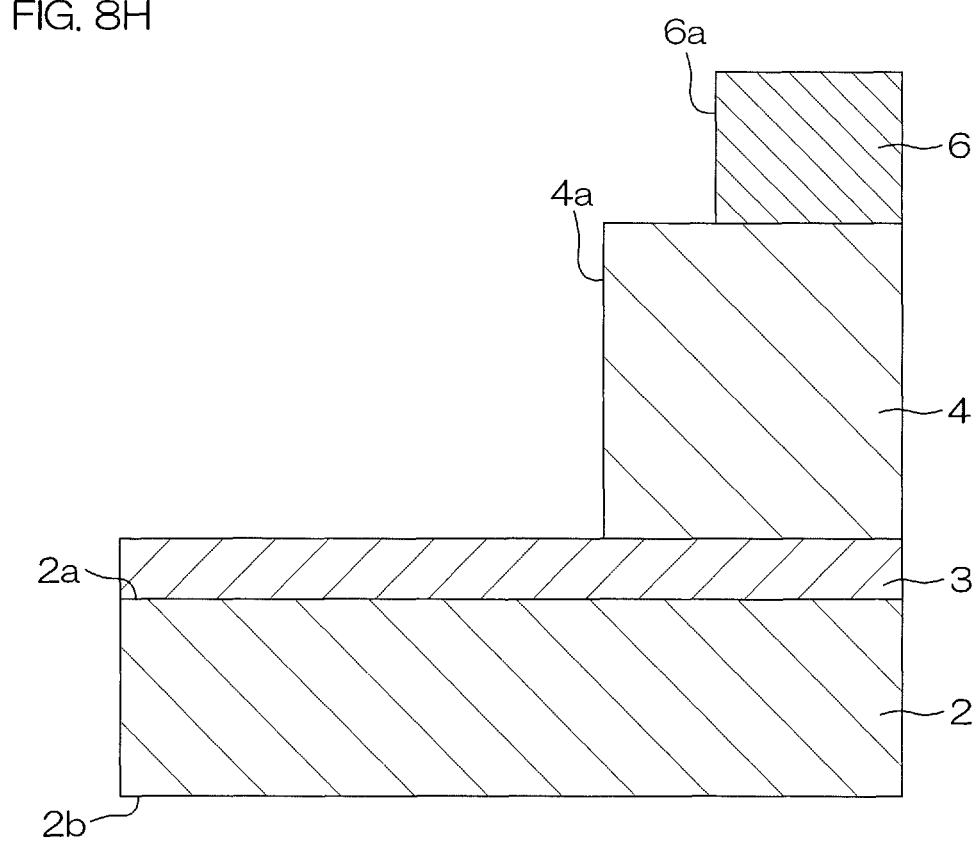
FIG. 8H is a sectional view showing a step subsequent to that of FIG. 8G.

Next, as shown in FIG. 7H and FIG. 8H, the four corner portions of the light absorbing layer 4 are removed by photolithography and etching. The chamfered portions 4a are thereby formed at the four corner portions of the light absorbing layer 4.

Figure 8I:
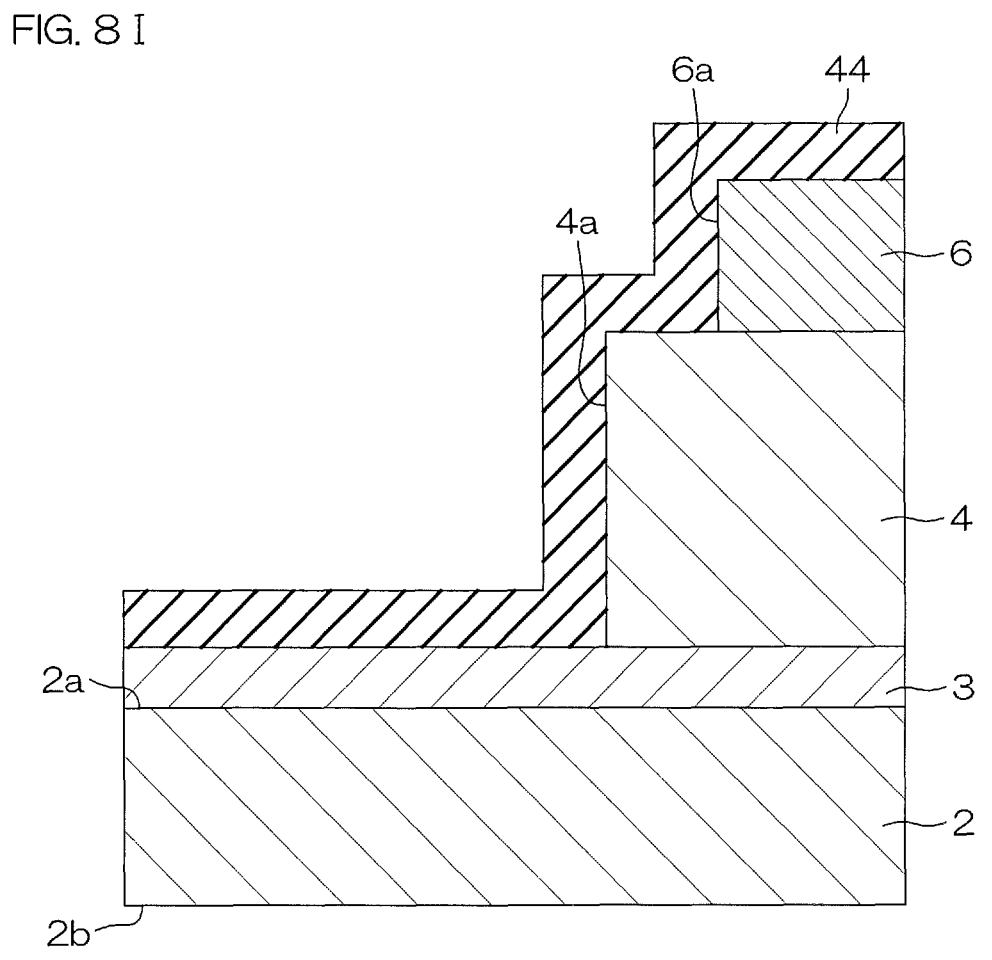

Next, as shown in FIG. 7I and FIG. 8I, an insulating material film 44 that is a material film of the insulating film 10 is formed over all exposed front surfaces by the plasma CVD method, LPCVD method, MOCVD method, sputtering method, etc.

Figure 7J:
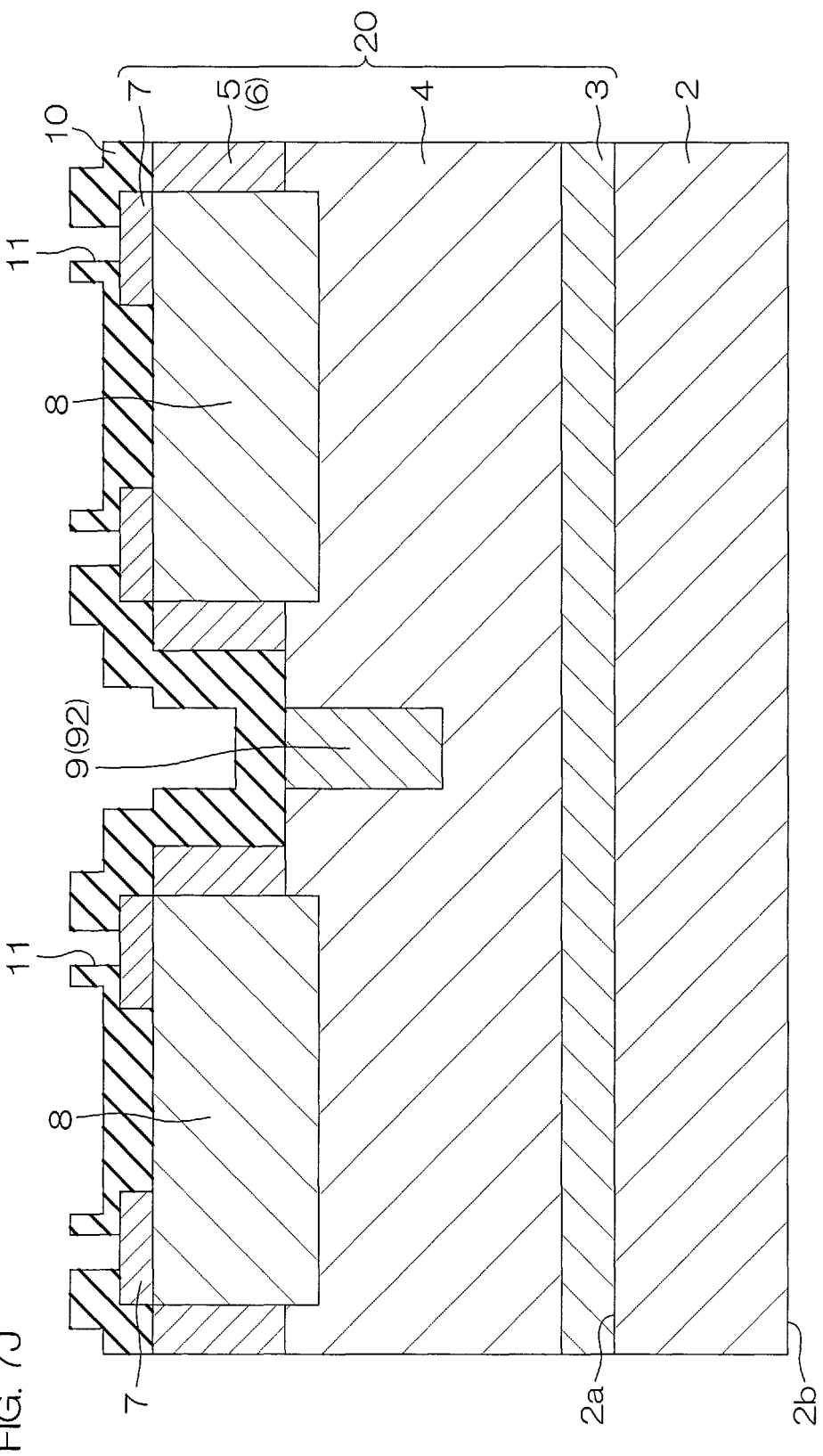
Figure 8J:
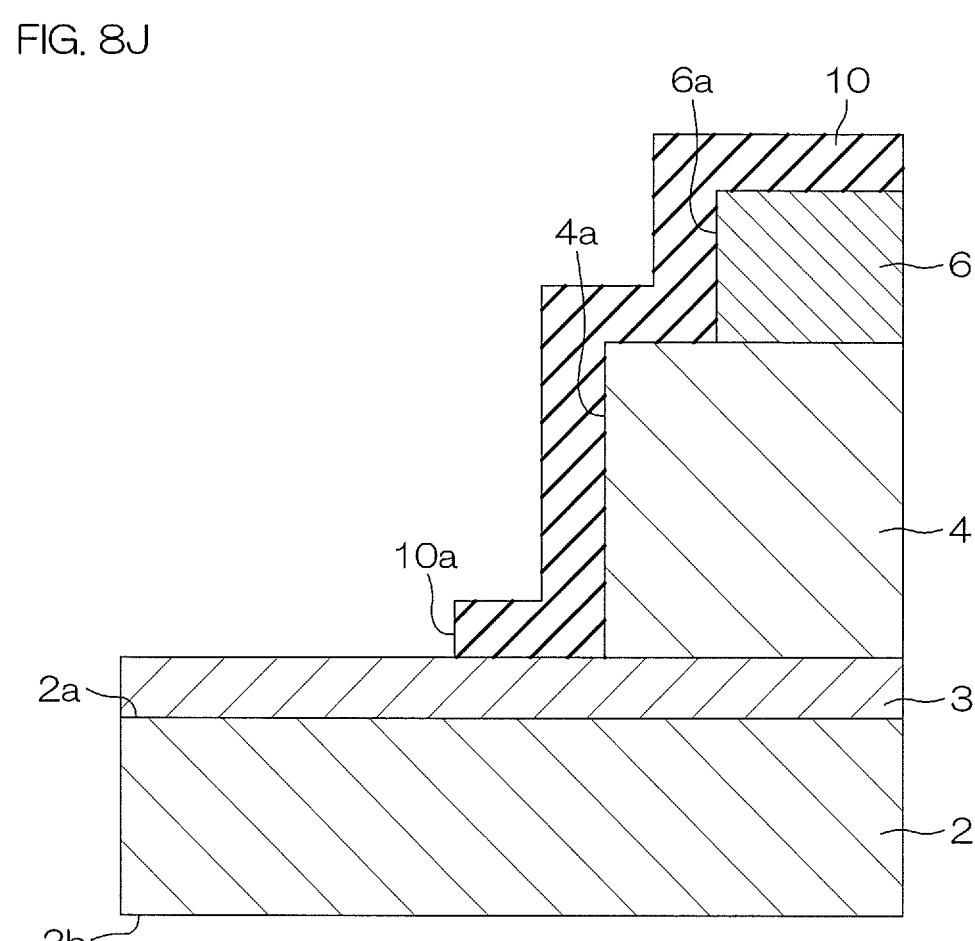
FIG. 8J is a sectional view showing a step subsequent to that of FIG. 8I.

Next, as shown in FIG. 7J and FIG. 8J, for each window layer 5, the contact hole 11 that exposes a portion of the contact layer 7 is formed in the insulating material film 44 by photolithography and etching. Also, from the insulating material film 44 on the four corner portions of the buffer layer 3 front surface, portions other than portions in the vicinities of the chamfered portions 4a of the light absorbing layer 4 are removed. The insulating film 10 having the chamfered portions 10a at the four corner portions is thereby obtained. The four corner portions of the buffer layer 3 front surface are thereby exposed.

Figure 7K:
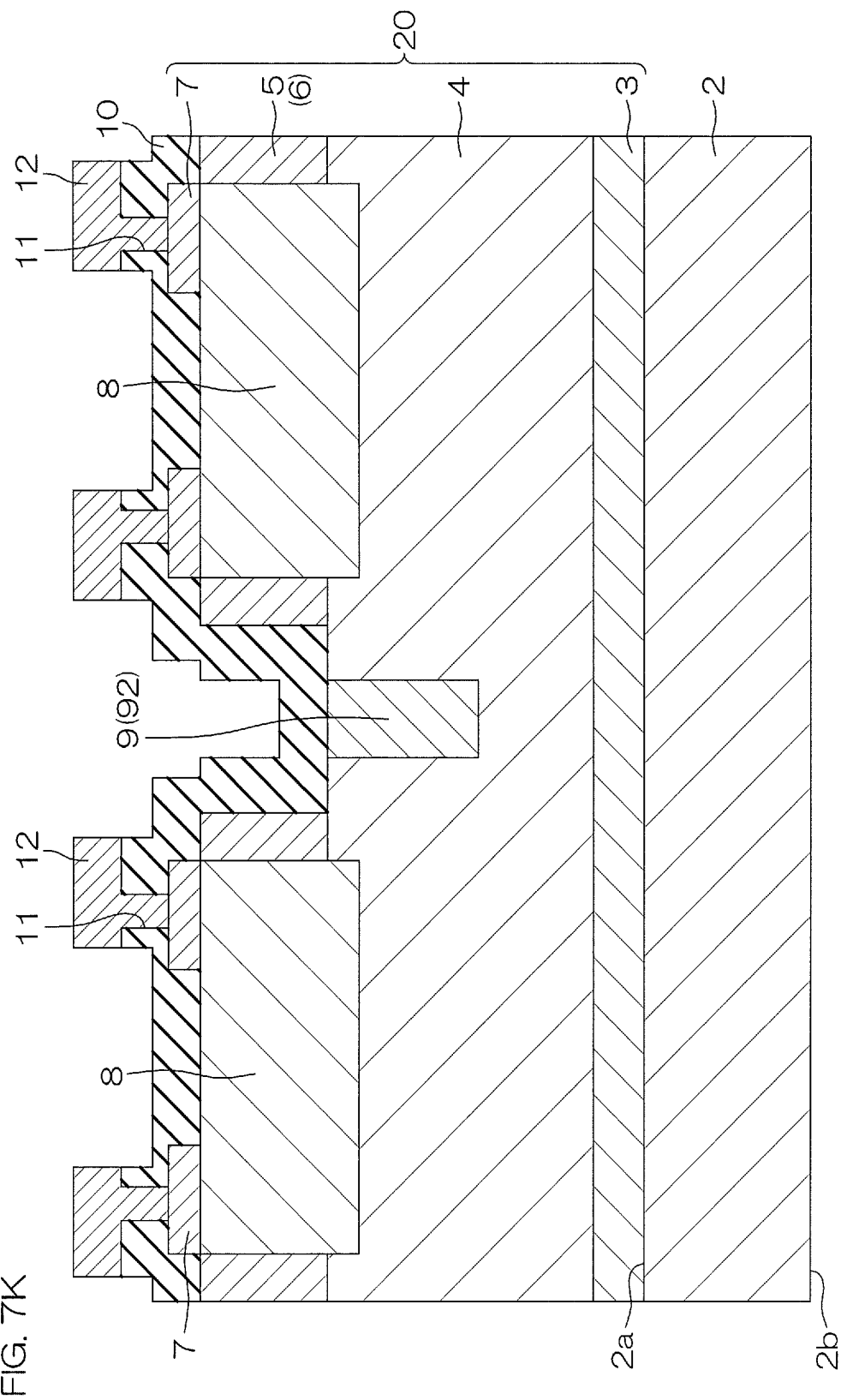
Figure 8K:
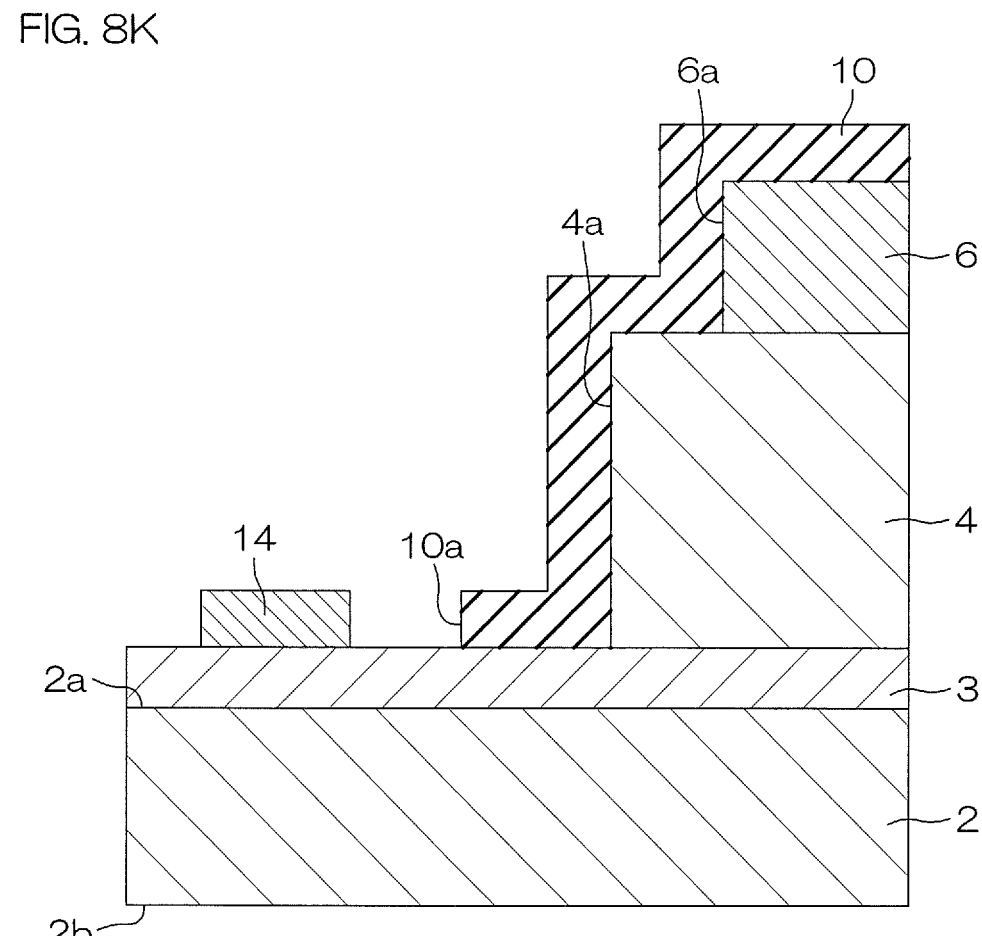
FIG. 8K is a sectional view showing a step subsequent to that of FIG. 8J.

Next, an electrode film that is a material film of the first electrodes 12, the third electrodes 14, the bonding pads 15, the wirings 16, and the marks 17 and 18 is formed by an electron beam vapor deposition method, sputtering method, etc., such as to cover the exposed surfaces of the corner portions of the buffer layer 3 and the insulating film 10. The electrode film is then patterned by photolithography and etching. Thereby, the plurality of first electrodes 12, the plurality of bonding pads 15, the plurality of wirings 16, and the plurality of marks 17 and 18 are formed on the insulating film 10 and the third electrodes 14 are respectively formed on the four corner portions of the buffer layer 3 as shown in FIG. 7K and FIG. 8K.

Lastly, film-thinning of the substrate 2 is performed by grinding the substrate 2 from the second main surface 2b side. The second electrode 13 is then formed on the second main surface 2b of the thinned substrate 2. The light receiving element array 1 such as shown in FIG. 1A to FIG. 3 is thereby obtained.

Figure 9:
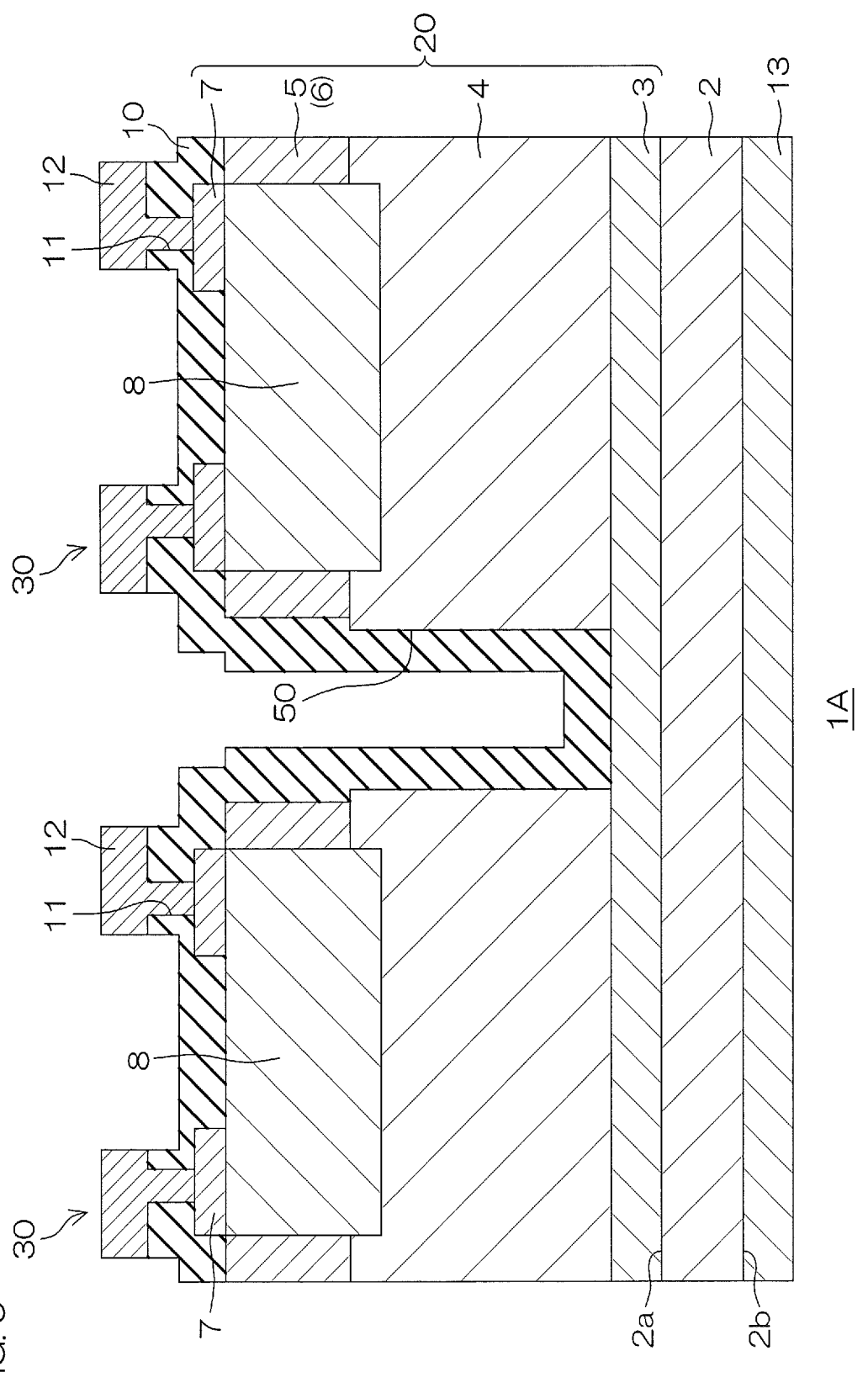
FIG. 9 is a sectional view for describing the arrangement of a light receiving element array according to a second preferred embodiment of the present disclosure.

FIG. 9 is a sectional view for describing the arrangement of a light receiving element array according to a second preferred embodiment of the present disclosure. FIG. 9 is a sectional view corresponding to the section plane of FIG. 2. In FIG. 9, portions corresponding to respective portions of FIG. 2 described above are indicated with the same reference signs attached as in FIG. 2.

The light receiving element array 1A shown in FIG. 9 differs from the light receiving element array 1 shown in FIG. 1A to FIG. 3 in the point that the second p-type region 9 is not formed in the light absorbing layer 4, the point that a separating groove 50 is formed in the light absorbing layer 4 such as to surround the window layers 5 in plan view, and the point that inner surfaces (bottom surface and side surfaces) of the separating groove 50 are covered by the insulating film 10. Structures besides the above are the same as the structures of the light receiving element array 1 shown in FIG. 1A to FIG. 3. With the light receiving element array 1A according to the second preferred embodiment, since the second p-type region 9 is not present, regions corresponding to the first p-type regions 8 of the light receiving element array 1 according to the first preferred embodiment shall be referred to as the p-type regions 8.

Plan views of the light receiving element array 1A according to the second preferred embodiment are the same as FIG. 1A and FIG. 1B that are plan views of the light receiving element array 1 according to the first preferred embodiment. However, since the second p-type region 9 is not present in the light receiving element array 1A according to the second preferred embodiment, broken lines expressing the second p-type region 9 in FIG. 1B should be deemed to be broken lines expressing the separating groove 50. In other words, the region in FIG. 1B added with dots should be deemed to be the region in which the separating groove 50 is formed.

The separating groove 50 is formed in a lattice in plan view in the central region of the light absorbing layer 4. That is, the separating groove 50 is constituted, in plan view, of a plurality of first portions (portions indicated by the reference sign 50 in FIG. 9) that extend in the lateral direction at equal intervals in the longitudinal direction and a plurality of second portions (portions not appearing in FIG. 9) that extend in the longitudinal direction at equal intervals in the lateral direction and intersect with the plurality of first portions. The separating groove 50 with a plurality of rectangular annular shapes that surround each of the respective window layers 5 in plan view is formed by the plurality of first portions and the plurality of second portions.

In this preferred embodiment, the separating groove 50 penetrates through the light absorbing layer 4 from the front surface of the light absorbing layer 4 and reaches the buffer layer 3. The separating groove 50 may instead extend from the front surface of the light absorbing layer 4 to an intermediate thickness of the light absorbing layer 4.

In the second preferred embodiment, the separating groove 50 is formed in the light absorbing layer 4 such as to surround each of the plurality of window layers 5 (light receiving elements 30) in plan view. Thereby, when light is made incident on a certain light receiving element 30, the electrons and holes generated inside the light absorbing layer 4 of the certain light receiving element 30 can be suppressed from moving to an adjacent light receiving element 30. The crosstalk can thereby be reduced.

In the following, a sample of the light receiving element array 1A shown in FIG. 9 is referred to at times as a third sample. With the third sample, the electric current (first electric current I1) that flows through a certain light receiving element when light of 1 mW is made incident on the certain light receiving element, the electric current (second electric current I2) that flows through a light receiving element adjacent to a certain light receiving element 30 when light of 1 mW is made incident on the certain light receiving element, and the dark current were measured.

Figure 10:
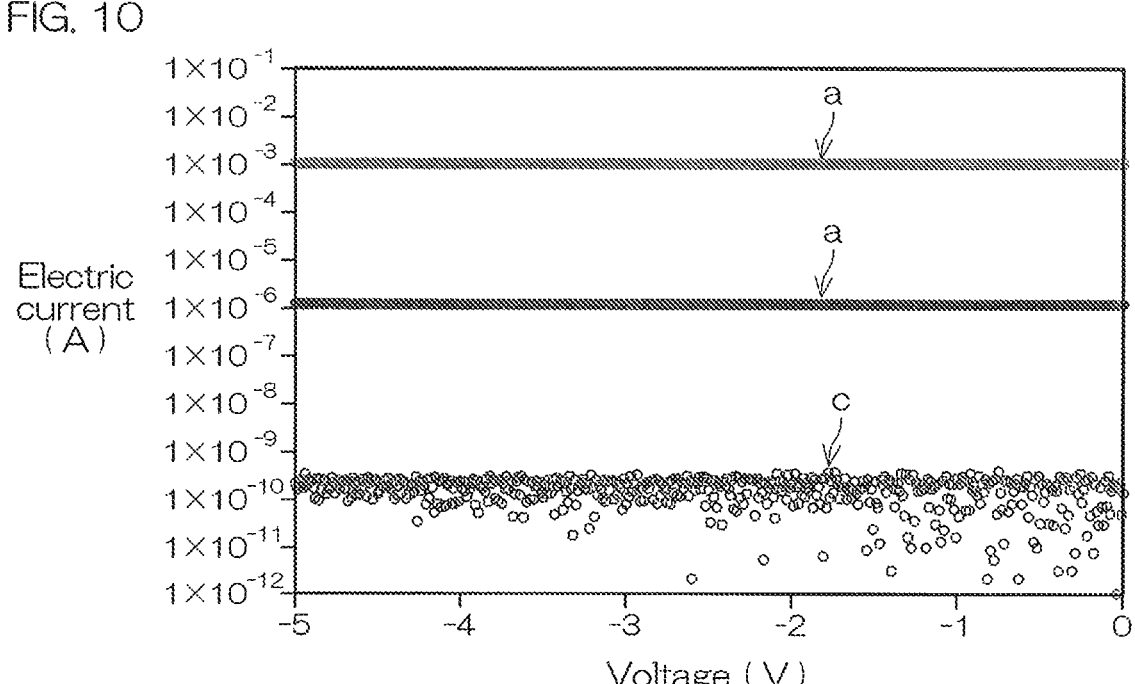
FIG. 10 is a graph showing measurement results for a third sample that is a sample of the light receiving element array shown in FIG. 9.

FIG. 10 is a graph showing measurement results for the third sample. In FIG. 10, a straight line a represents a graph of the first current I1, a straight line b represents a graph of the second current I2, and a dot group c of circular points represents a graph of the dark current.

From FIG. 5 and FIG. 10, it can be understood that with the third sample, the second current is greatly lowered in comparison to the first sample. Also, if $\{(I2/I1)\times100\}$ is deemed to be the crosstalk characteristic [%], whereas the crosstalk characteristic was 2.32% with the first sample, the crosstalk characteristic was 0.12% with the third sample. That is, it can be understood that with the third sample, the crosstalk is greatly decreased in comparison to the first sample. It can also be understood that with the third sample, the dark current is reduced in comparison to the first sample.

FIG. 11A to FIG. 11H are sectional views for describing an example of a manufacturing process of the light receiving element array 1A described above and are sectional views corresponding to a section plane of FIG. 9.

Figure 11A:
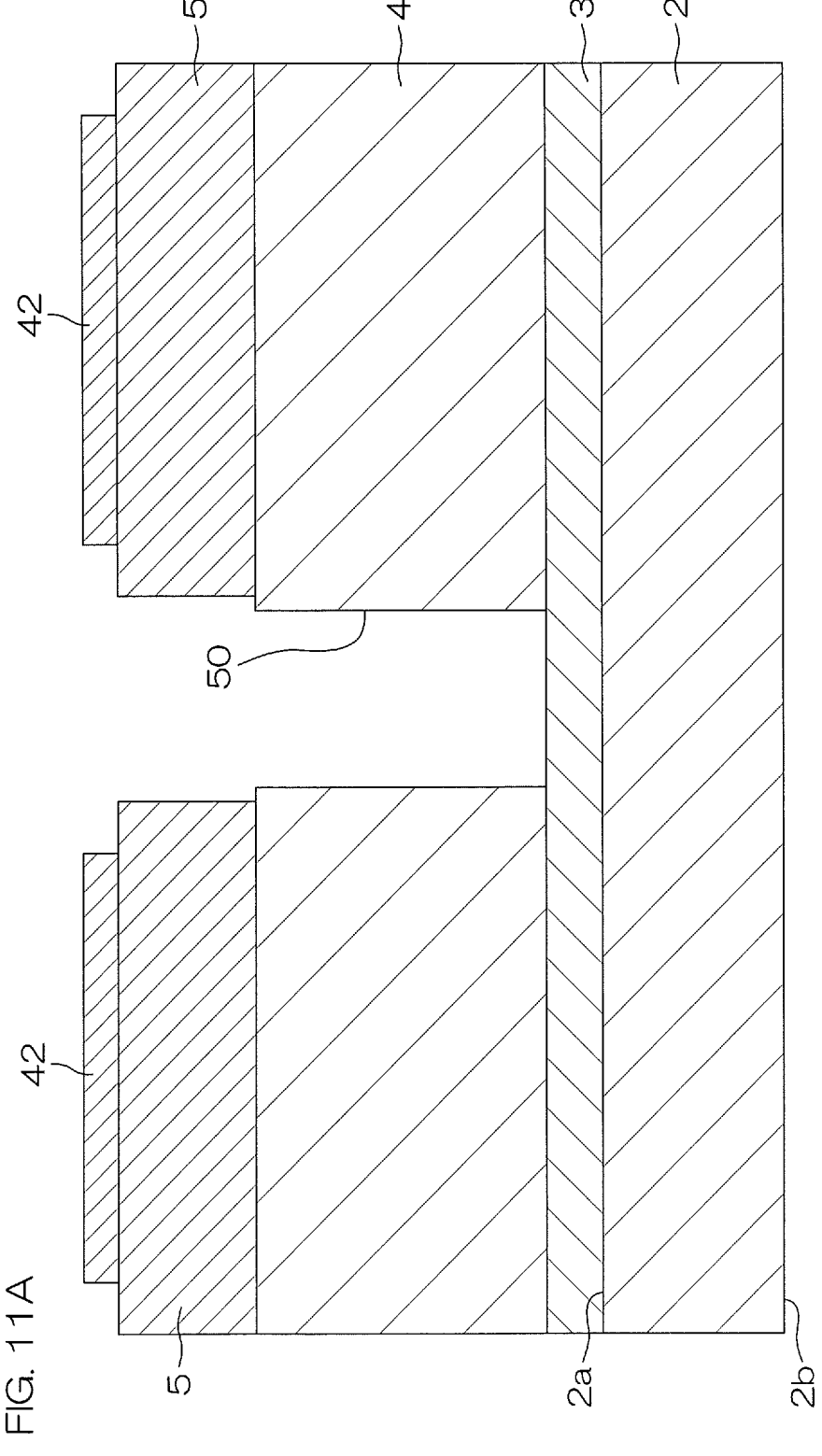
FIG. 11A is a sectional view showing an example of a manufacturing process of the light receiving element array shown in FIG. 9.

Even in manufacturing the light receiving element array 1A, the same steps as those of FIG. 7A to FIG. 7C described above are performed. When the step of FIG. 7C ends, the separating groove 50 that is disposed such as to surround each of the window layers 5 in plan view is formed in the light absorbing layer 4 by photolithography and etching as shown in FIG. 11A.

Figure 11B:
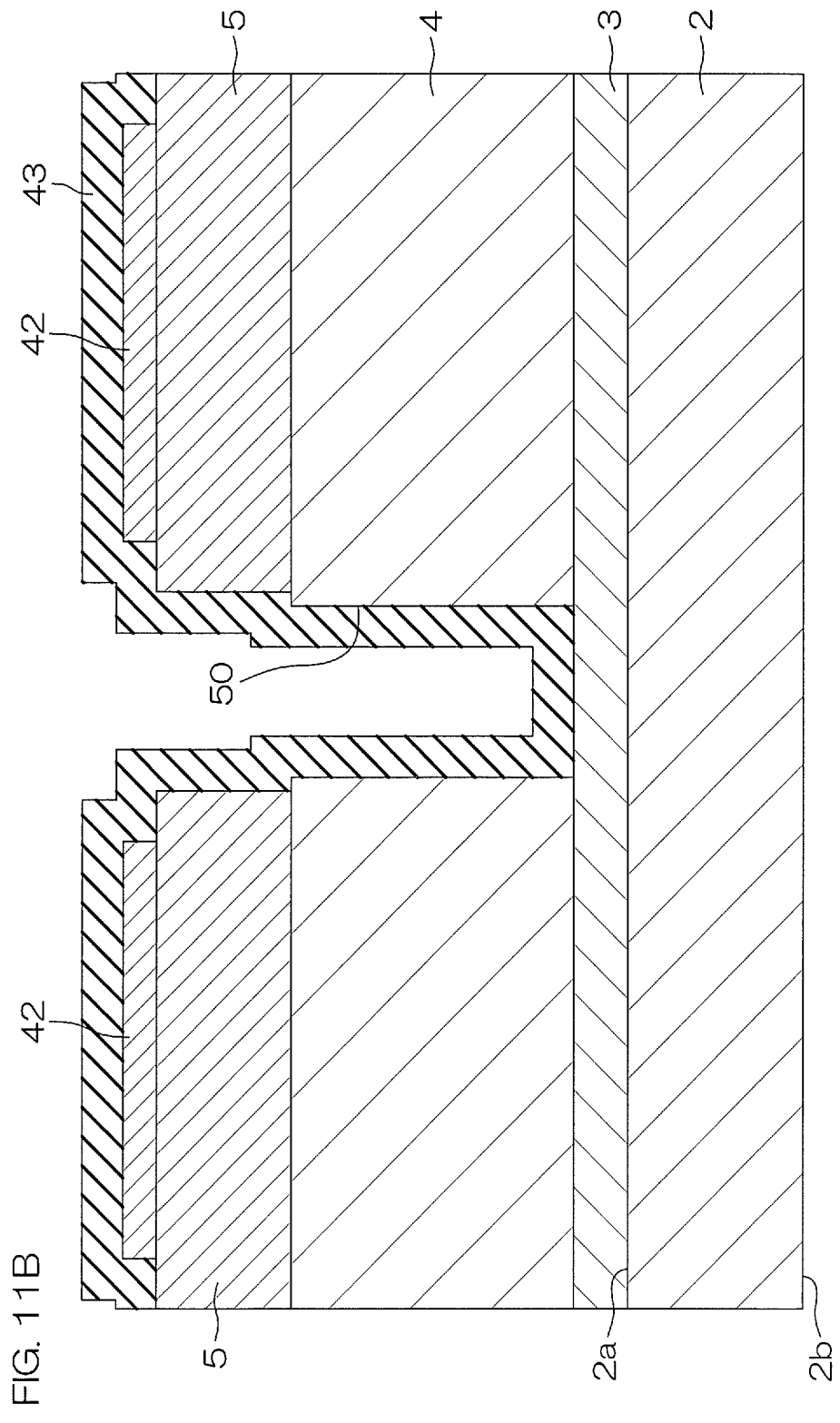
FIG. 11B is a sectional view showing a step subsequent to that of FIG. 11A.

Next, as shown in FIG. 11B, the insulating film 43 for masking is formed over all exposed front surfaces by the plasma CVD method, LPCVD method, MOCVD method, sputtering method, etc.

Figure 11C:
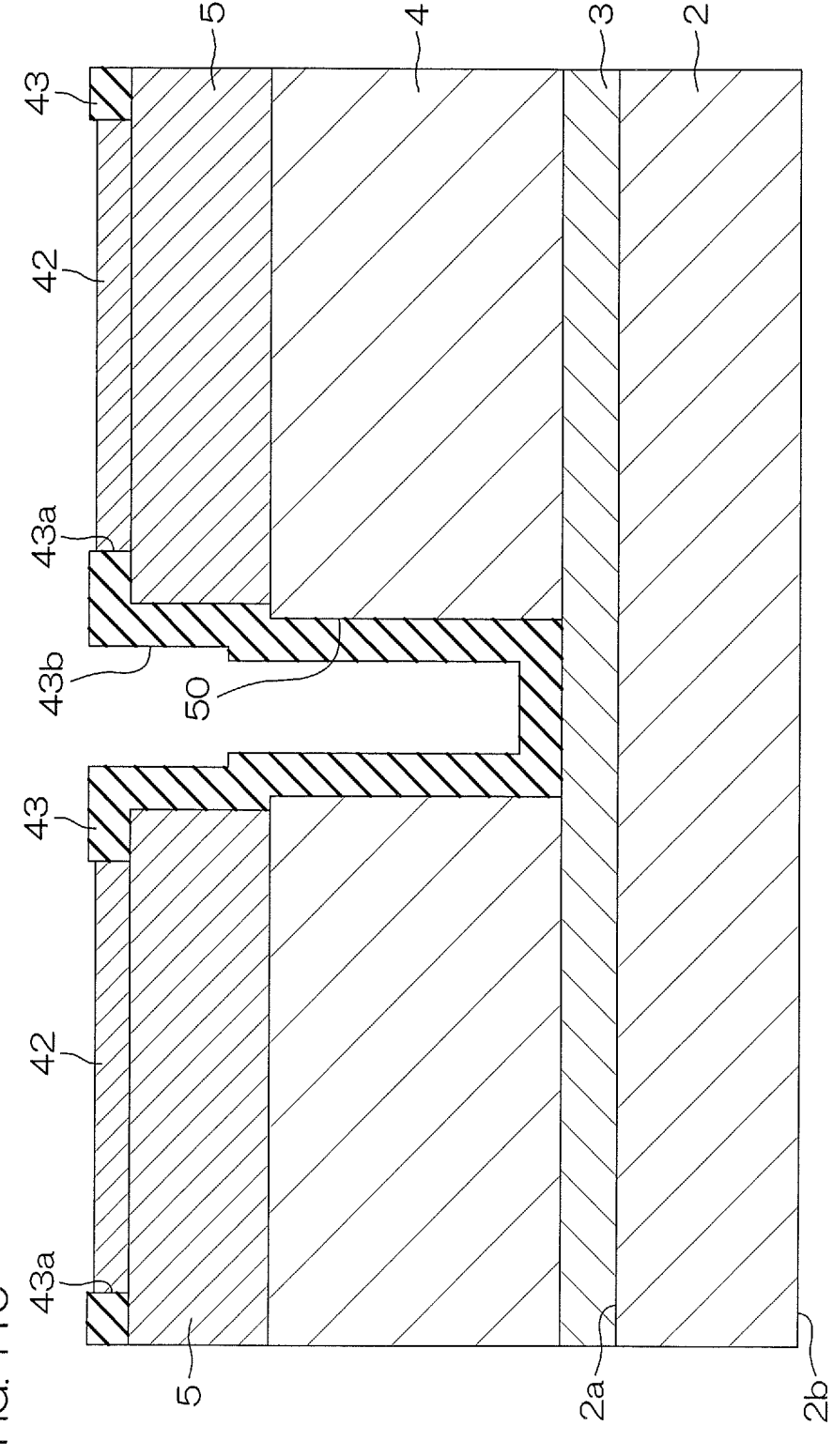
FIG. 11C is a sectional view showing a step subsequent to that of FIG. 11B.

Next, as shown in FIG. 11C, portions covering the front surfaces (upper surfaces) of the contact material layers 42 are removed from the insulating film 43 by photolithography and etching. The opening portions 43a for forming the p-type regions 8 are thereby formed in the insulating film 43.

Figure 11D:
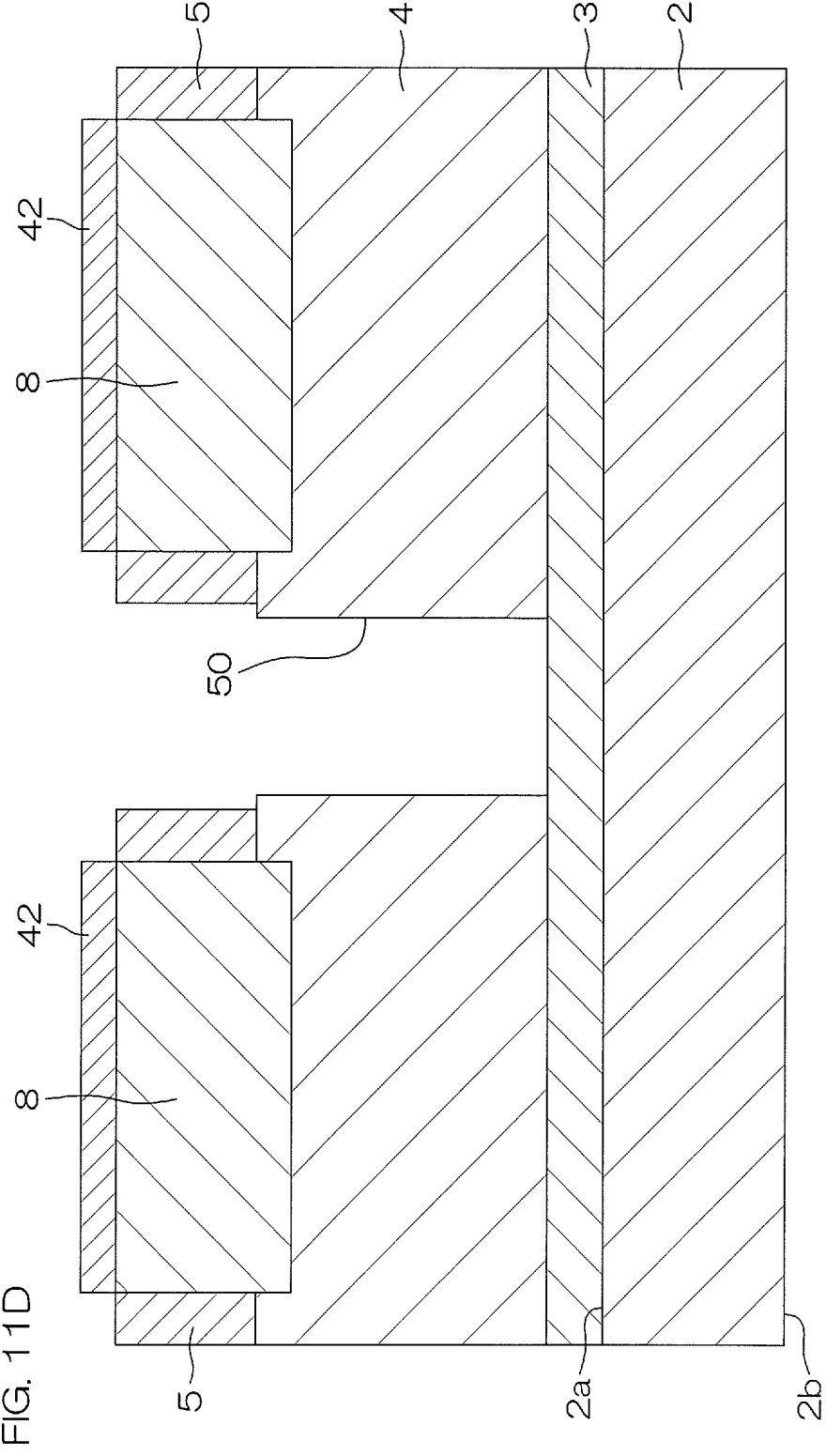
FIG. 11D is a sectional view showing a step subsequent to that of FIG. 11C.

Next, as shown in FIG. 11D, the insulating film 43 is used as a mask to make Zn diffuse into the contact material layers 42, the window layers 5, and the light absorbing layer 4 via the opening portions 43a. The p-type regions 8 are thereby formed inside the window layers 5 and the light absorbing layer 4. Thereafter, the insulating film 43 is removed.

Figure 11E:
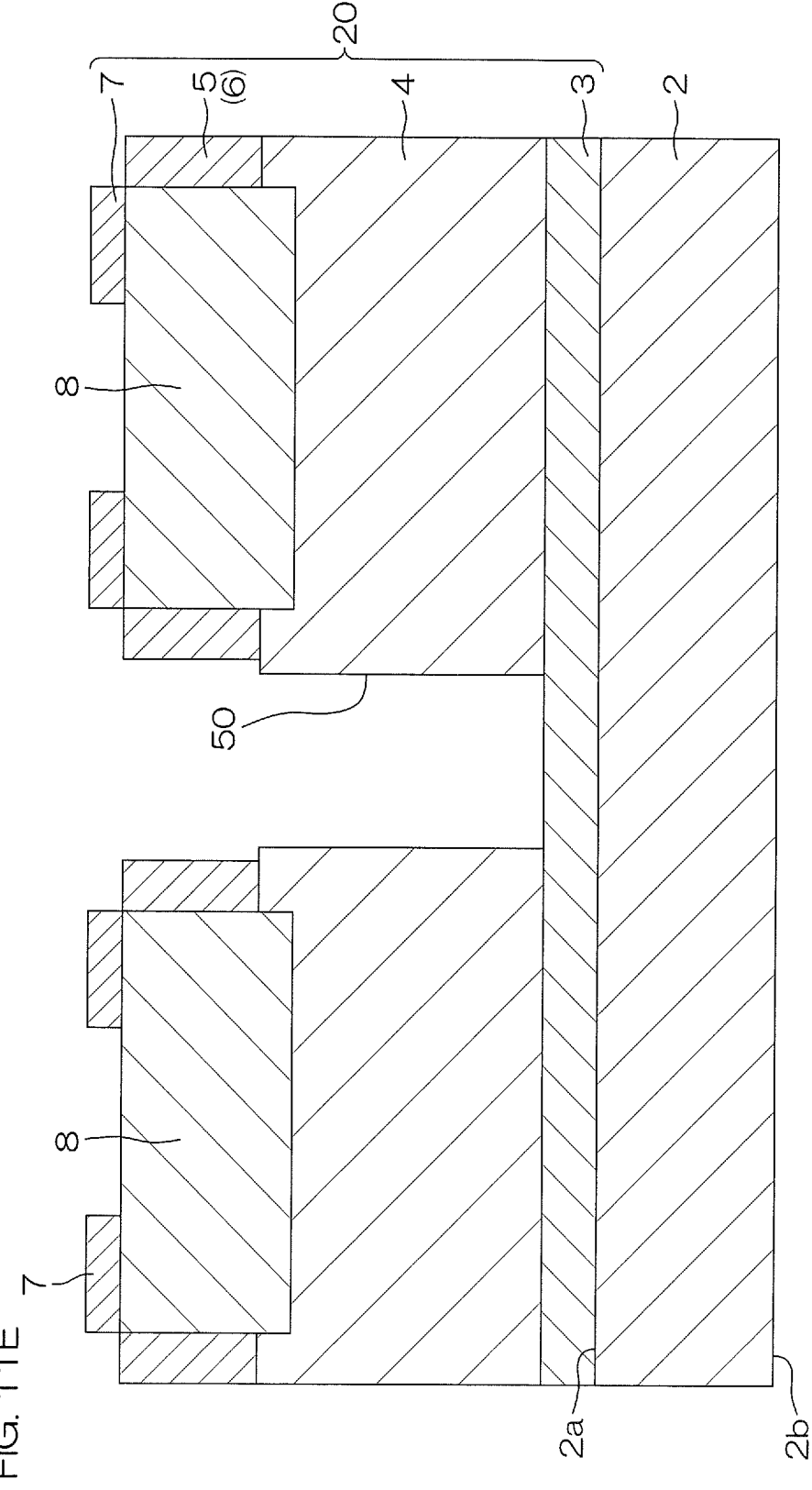
FIG. 11E is a sectional view showing a step subsequent to that of FIG. 11D.

Next, as shown in FIG. 11E, the contact material layers 42 are patterned by photolithography and etching. The contact layers 7 of circular annular shapes in plan view that contact the peripheral edge portions of the first p-type region 8 front surfaces are thereby formed on the respective window layers 5. The laminated semiconductor structure 20 that includes the buffer layer 3, the light absorbing layer 4, the window layers 5, the n-type layer 6, and the contact layers 7 is thereby obtained.

Next, the four corner portions of the light absorbing layer 4 are removed by photolithography and etching. The chamfered portions 4a are thereby formed at the four corner portions of the light absorbing layer 4.

Figure 11F:
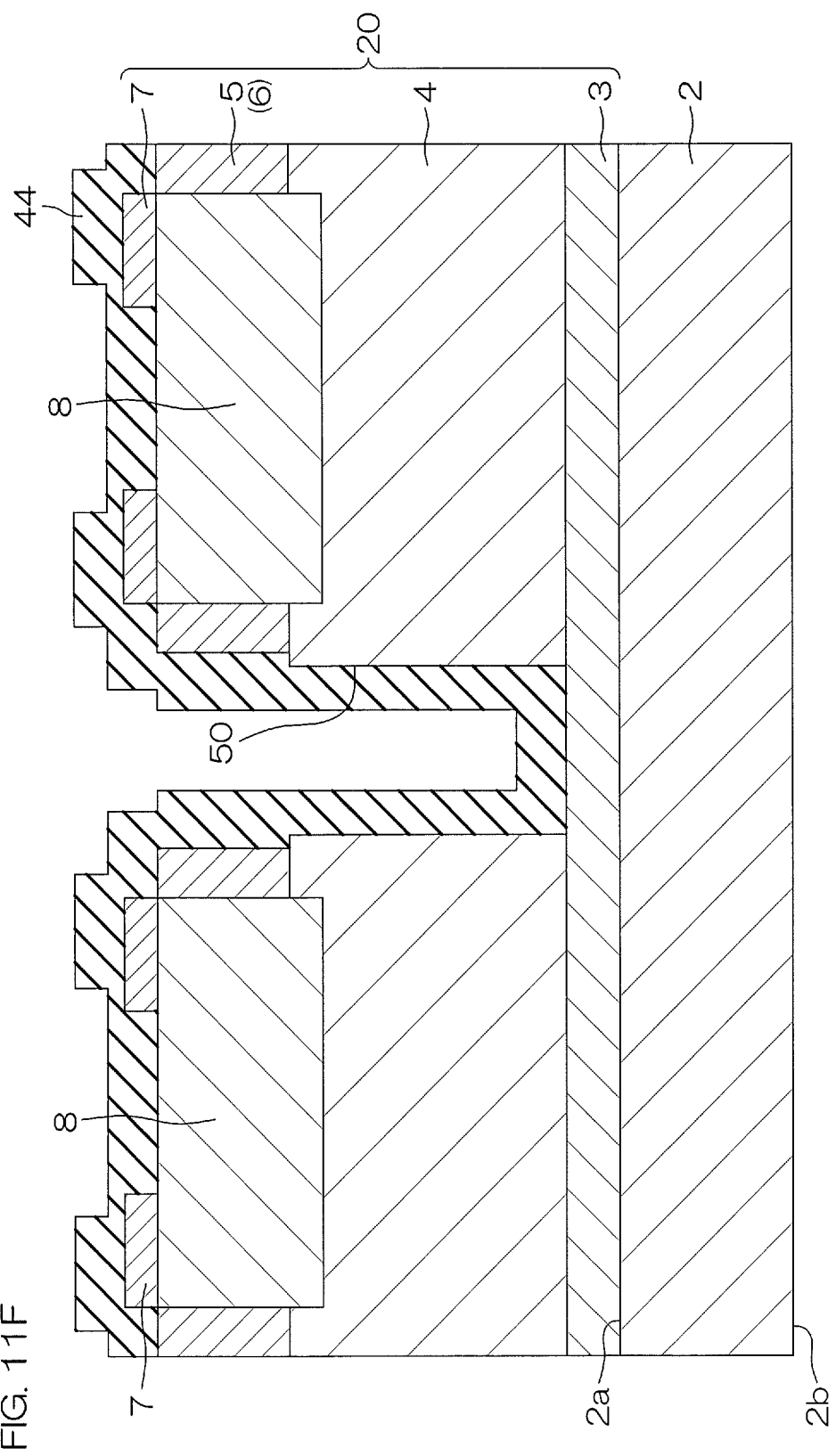
FIG. 11F is a sectional view showing a step subsequent to that of FIG. 11E.

Next, as shown in FIG. 11F, the insulating material film 44 that is the material film of the insulating film 10 is formed over all exposed front surfaces by the plasma CVD method, LPCVD method, MOCVD method, sputtering method, etc.

Figure 11G:
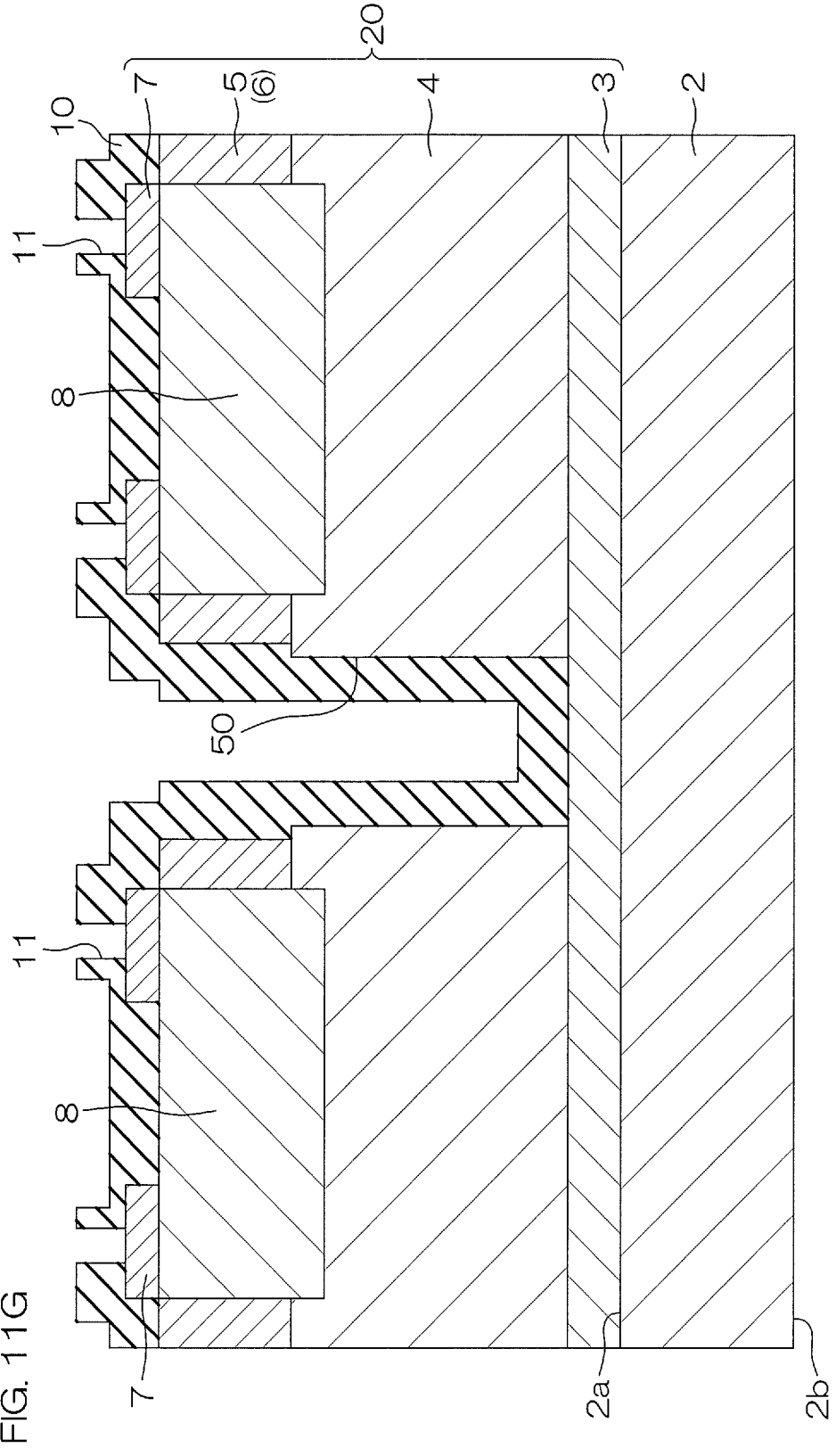
FIG. 11G is a sectional view showing a step subsequent to that of FIG. 11F.

Next, as shown in FIG. 11G, for each window layer 5, the contact hole 11 that exposes a portion of the contact layer 7 is formed in the insulating material film 44 by photolithography and etching. Also, from the insulating material film 44 on the four corner portions of the buffer layer 3 front surface, the portions other than the portions in the vicinities of the chamfered portions 4a of the light absorbing layer 4 are removed. The insulating film 10 having the chamfered portions 10a at the four corner portions is thereby obtained. The four corner portions of the buffer layer 3 front surface are thereby exposed.

Figure 11H:
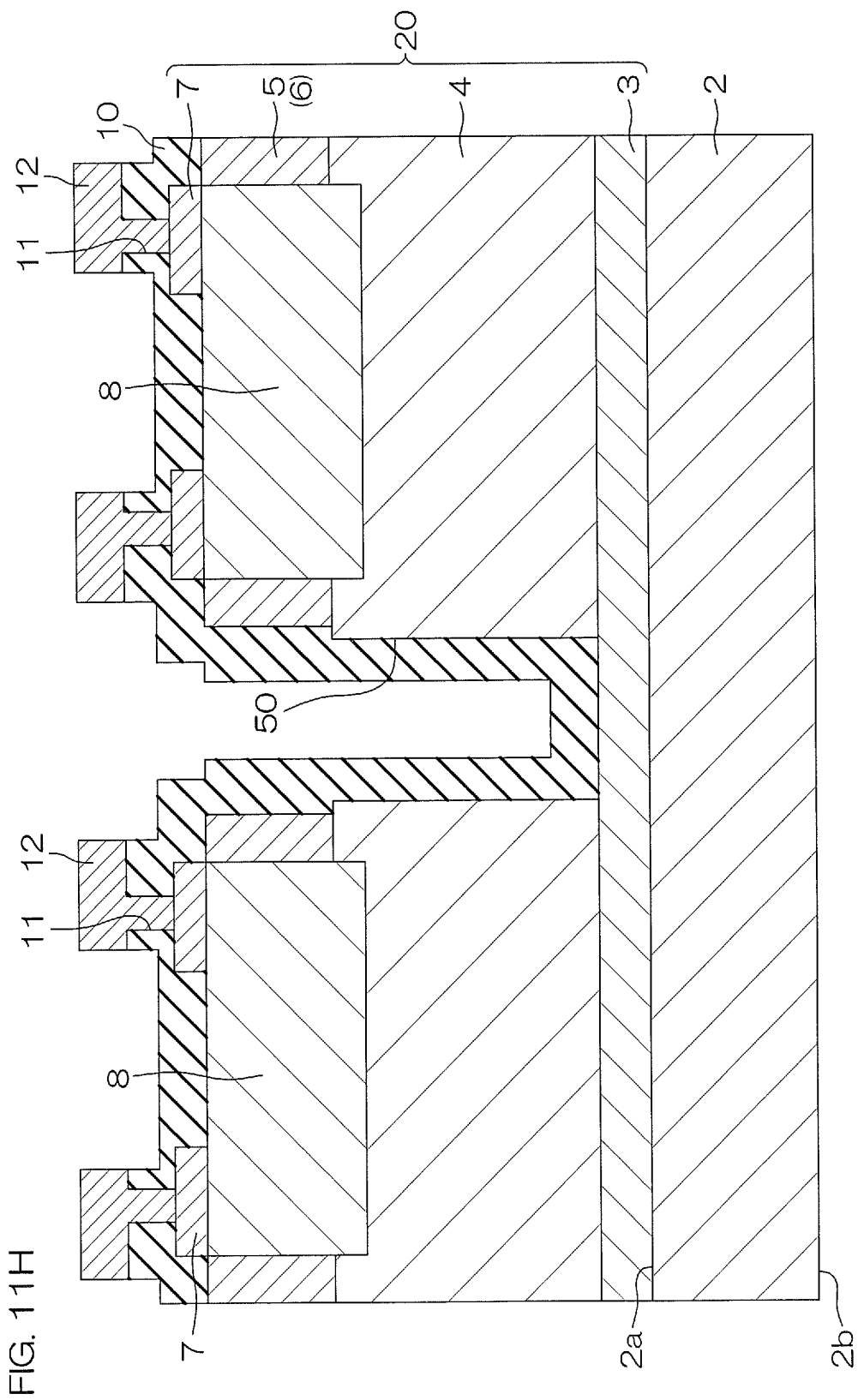
FIG. 11H is a sectional view showing a step subsequent to that of FIG. 11G.

Next, the electrode film that is the material film of the first electrodes 12, the third electrodes 14, the bonding pads 15, the wirings 16, and the marks 17 and 18 is formed by the electron beam vapor deposition method, sputtering method, etc., such as to cover the exposed portions of the front surfaces of the four corner portions of the buffer layer 3 and the insulating film 10. The electrode film is then patterned by photolithography and etching. Thereby, the plurality of first electrodes 12, the plurality of bonding pads 15, the plurality of wirings 16, and the plurality of marks 17 and 18 are formed on the insulating film 10 and the third electrodes 14 are respectively formed on the four corner portions of the buffer layer 3 as shown in FIG. 11H.

Lastly, film-thinning of the substrate 2 is performed by grinding the substrate 2 from the second main surface 2b side. The second electrode 13 is then formed on the second main surface 2b of the thinned substrate 2. The light receiving element array 1A such as shown in FIG. 19 is thereby obtained.

Although with the first and second preferred embodiments described above, the light receiving element arrays 1 and 1A each include 16 light receiving elements 30, it suffices that the light receiving element arrays 1 and LA each include a plurality of light receiving elements and the number of light receiving elements can be set arbitrarily.

Also, although the plurality of light receiving elements 30 are disposed two-dimensionally, these may be disposed one-dimensionally instead.

Although the first p-type regions 8 are of circular shapes in plan view, these may be of polygonal shapes, such as quadrilateral shapes (square shapes, rectangular shapes, etc.), regular hexagonal shapes, etc., in plan view instead.

Also, in each of the first and second preferred embodiments described above, the respective conductivity types of the substrate 2 of the n-type, the buffer layer 3 of the n-type, the window layers 5 of the n-type, and the n-type layer 6 of the n-type and the respective conductivity types of the contact layers 7 of the p-type, the first p-type regions 8 of the p-type, and the second p-type region 9 of the p-type may be inverted. That is, a portion of the n-type may be made to be of the p-type and a portion of the p-type may be made to be of the n-type.

While preferred embodiments of the present disclosure were described in detail above, these are merely specific examples used to clarify the technical contents of the present disclosure and the present disclosure should not be interpreted as being limited to these specific examples and the scope of the present disclosure is limited only by the appended claims.

The present application corresponds to Japanese Patent Application No. 2021-047583 filed on Mar. 22, 2021 in the Japan Patent Office, and the entire disclosure of this application is incorporated herein by reference.

The invention claimed is:

1. A light receiving element array comprising:

a substrate; and a laminated semiconductor structure that is formed on the substrate;

wherein:

the laminated semiconductor structure includes a light absorbing layer that is disposed above the substrate, and a plurality of window layers of a first conductivity type that are formed apart from each other on the light absorbing layer, there is formed, inside the laminated semiconductor structure, for each window layer, a first region of a second conductivity type that extends into the light absorbing layer from a surface of the window layer at an opposite side to the light absorbing layer, and there is formed, inside the light absorbing layer, a second region of the second conductivity type that is disposed such as to surround each of the plurality of window layers in plan view and extends from a surface of the light absorbing layer at an opposite side to the substrate toward a surface of the light absorbing layer at a substrate side, the light receiving element array includes an insulating film that covers an exposed surface of the light absorbing layer, an exposed surface of the window layers, exposed surfaces of the first region of the second conductivity type and exposed surfaces of the second region of the second conductivity type, and a groove extending along the second region of the second conductivity type is formed on an upper surface of the insulating film above the second region of the second conductivity type.

2. The light receiving element array according to claim 1, wherein a surface of the light absorbing layer at the opposite side to the substrate is defined as a first surface, a surface of the light absorbing layer at the substrate side is defined as a second surface, and the second of second conductively type region extends from the first surface to an intermediate portion between the first surface and the second surface of the light absorbing layer.

3. The light receiving element array according to claim 1, wherein the second region of the second conductivity type penetrates through the light absorbing layer.

4. The light receiving element array according to claim 1, comprising:

a plurality of first electrodes that are provided for each window layer and disposed on the insulating film; and wherein each first electrode is electrically connected to a corresponding first of second conductivity type regions.

5. The light receiving element array according to claim 4, wherein the insulating film is an antireflection film that prevents reflection of light of a wavelength set in advance.

6. The light receiving element array according to claim 4, wherein the first electrodes are of endless shapes in plan view.

7. The light receiving element array according to claim 1, comprising: a second electrode that is formed on a second main surface of the substrate.

8. The light receiving element array according to claim 1, wherein the plurality of window layers are disposed in a matrix in plan view.

9. The light receiving element array according to claim 1, wherein the laminated semiconductor structure includes a buffer layer of the first conductivity type that is formed between the substrate and the light absorbing layer.

10. The light receiving element array according to claim 9, wherein the buffer layer has an exposed surface at a portion of a surface at an opposite side to the substrate and a third electrode is formed on the exposed surface.

11. The light receiving element array according to claim 9, wherein the substrate is an n-type InP substrate, the buffer layer is an n-type InP layer, the light absorbing layer is a non-doped InGaAs layer, and the window layers are n-type InP layers.

12. The light receiving element array according to claim 1, wherein the substrate is an n-type InP substrate, the light absorbing layer is a non-doped InGaAs layer, and the window layers are n-type InP layers.

13. A light receiving element array comprising:

a substrate; and a laminated semiconductor structure that is formed on the substrate;

wherein:

the laminated semiconductor structure includes a light absorbing layer that is disposed above the substrate, and a plurality of window layers of a first conductivity type that are formed apart from each other on the light absorbing layer, there is formed, inside the laminated semiconductor structure, for each window layer, a second conductivity type region that extends into the light absorbing layer from a surface of the window layer at an opposite side to the light absorbing layer, and there is formed, inside the light absorbing layer, a separating groove that is disposed so as to surround each of the plurality of window layers in plan view and extends from a surface of the light absorbing layer at an opposite side to the substrate toward a surface of the light absorbing layer at a substrate side, and the light receiving element array includes an insulating film that covers a bottom surface and side surfaces of the separating groove.

14. The light receiving element array according to claim 13, wherein the separating groove penetrates through the light absorbing layer.

15. The light receiving element array according to claim 13, wherein the insulating film covers the plurality of window layers; and the light receiving element array includes a plurality of first electrodes that are provided for each window layer and disposed on the insulating film; and wherein each first electrode is electrically connected to a corresponding second conductivity type region.

16. The light receiving element array according to claim 15, wherein the insulating film is an antireflection film that prevents reflection of light of a wavelength set in advance.

17. The light receiving element array according to claim 15, wherein the first electrodes are of endless shapes in plan view.

* * * * *